(12) United States Patent
Kamijima

(10) Patent No.: US 7,148,152 B2
(45) Date of Patent: Dec. 12, 2006

(54) METHOD FOR FABRICATING A MASK, METHOD FOR FABRICATING A PATTERNED THIN FILM AND A MICRO DEVICE

(75) Inventor: Akifumi Kamijima, Chuo-ku (JP)

(73) Assignee: TDK Corporation, Tokyo (JP)

( * ) Notice: Subject to any disclaimer, the term of this patent is extended or adjusted under 35 U.S.C. 154(b) by 208 days.

(21) Appl. No.: 10/731,088

(22) Filed: Dec. 10, 2003

(65) Prior Publication Data

US 2004/0127041 A1    Jul. 1, 2004

(30) Foreign Application Priority Data

Dec. 26, 2002  (JP)  ............... 2002-377897

(51) Int. Cl.
*H01L 21/302* (2006.01)

(52) U.S. Cl. .............. 438/725; 430/14; 430/270.1; 430/314; 430/315

(58) Field of Classification Search ............. 438/315; 430/313, 315
See application file for complete search history.

(56) References Cited

U.S. PATENT DOCUMENTS

| | | |
|---|---|---|
| 3,148,983 A | 9/1964 | Endermann et al. |
| 5,352,564 A | 10/1994 | Takeda et al. |
| 5,422,221 A | 6/1995 | Okazaki et al. |
| 5,721,078 A | 2/1998 | Kamijima |
| 5,725,997 A | 3/1998 | Kamijima |
| 5,747,198 A | 5/1998 | Kamijima |
| 6,242,151 B1 | 6/2001 | Furihata et al. |
| 6,579,657 B1 * | 6/2003 | Ishibashi et al. ......... 430/270.1 |
| 6,916,597 B1 * | 7/2005 | Kamijima et al. .......... 430/314 |
| 2002/0187408 A1 * | 12/2002 | Thackeray et al. ........... 430/14 |
| 2003/0143490 A1 * | 7/2003 | Kozawa et al. ............. 430/315 |

FOREIGN PATENT DOCUMENTS

| | | | |
|---|---|---|---|
| JP | 37-18015 | | 8/1959 |
| JP | 04320347 A | * | 11/1992 |
| JP | A 6-242602 | | 9/1994 |
| JP | A 6-273934 | | 9/1994 |
| JP | A 9-96909 | | 4/1997 |
| JP | A 2000-63466 | | 2/2000 |
| JP | 2001228616 A | * | 8/2001 |

OTHER PUBLICATIONS

Abstract of Study for the design of high resolution novolak-DNQ photoresists: the effects of low-molecular-weight phenolic compounds on resist systems; Miyamoto et al.; Jul. 1995; SPIE vol. 2438, p. 223-234, Advances in Resist Technology and Processing XI.*

Abstract of Study for the design of high resolution novolak-DNQ photoresists: the effects of low-molecular-weight phenolic compounds on resist systems; Miyamoto et al.; Jul. 1995; SPIE vol. 2438, p. 223-234, Advances in Resist Technology and Processing XI.*

* cited by examiner

*Primary Examiner*—Nadine Norton
*Assistant Examiner*—Patricia A. George
(74) *Attorney, Agent, or Firm*—Oliff & Berridge, PLC

(57) ABSTRACT

A laminated resist pattern with a T-shaped cross section is formed on a film to be patterned. The laminated resist pattern is composed of a bottom resist pattern and a top resist pattern. The surface area of the top resist pattern is larger than the surface area of the bottom resist pattern, and increased after the film is patterned via the laminated resist pattern.

16 Claims, 17 Drawing Sheets

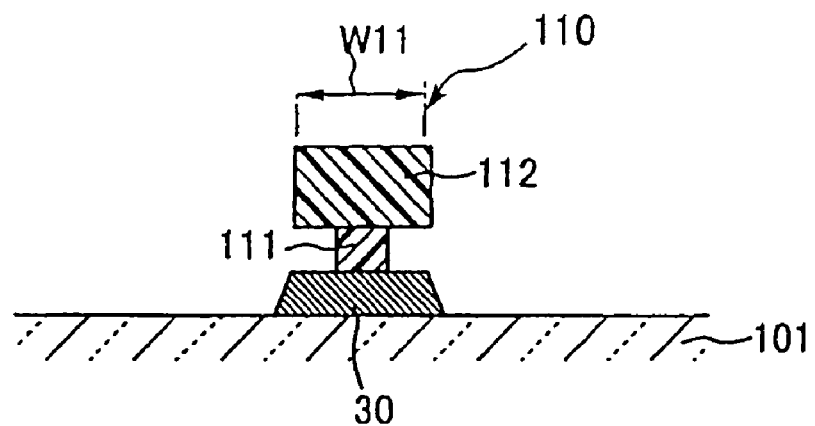
FIG. 11
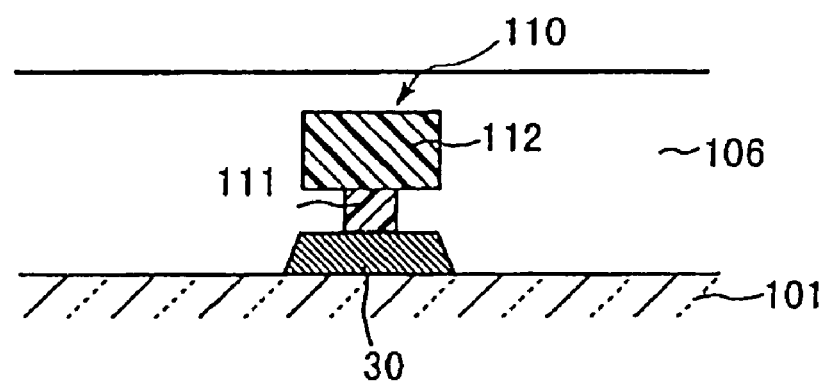
FIG. 12
FIG. 13
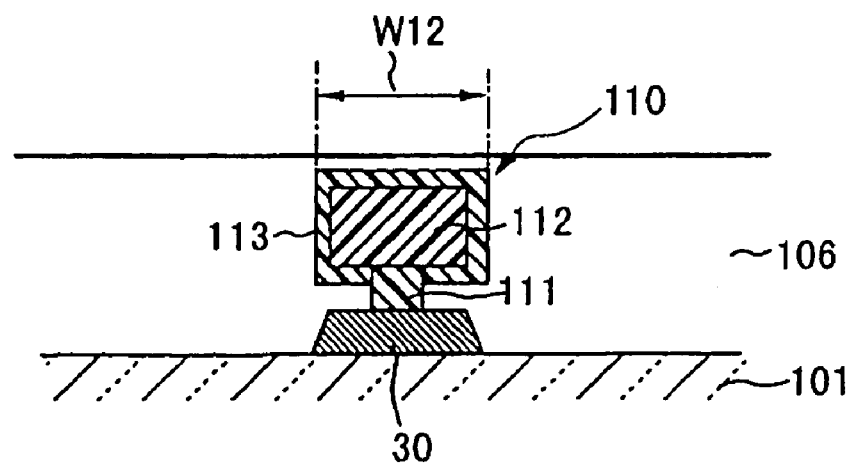

METHOD FOR FABRICATING A MASK, METHOD FOR FABRICATING A PATTERNED THIN FILM AND A MICRO DEVICE

BACKGROUND OF THE INVENTION

1. Field of the Invention

This invention relates to a method for fabricating a mask, a method for fabricating a patterned thin film and a micro device with the patterned thin film.

2. Related Art Statement

In the fabrication of a micro device with a patterned thin film, the patterned thin film is formed by utilizing a patterned resist mask. Herein, the "micro device" means a small-sized device formed by means of film-forming technique, and encompasses a semiconductor device, a thin film magnetic head, a sensor with a thin film, a actuator with a thin film and the like.

The patterned thin film is also formed by means of dry-etching (which is described as a milling patterning method in Patent Document 1), lift-off, the combination thereof or the like utilizing a mask.

Since the mask is made of a resist film through patterning process, the resist film is also made of a resist material suitable for the patterning process. As the resist material are exemplified an NQD-novolak resist (naphthaquinonediazide-novolak resist: Patent document 2), an integral type NGD-novolak resist (Patent document 3), an integral type hydrophobic NQD-novolak resist (Patent document 4) and a chemically amplified resist with polyhydroxystyrene (Patent document 5).

In the micro device such as a semiconductor device, a thin film magnetic head, a sensor with a thin film and an actuator with a thin film, it is often required that two kinds of patterned thin films are formed via a minute gap. In this case, conventionally, the first patterned thin film is formed via a given resist mask, which is removed later, and the second patterned thin film is formed via another resist mask suitable for the patterning process.

In the conventional technique, two different and independent patterning processes are required, so that the total fabrication process becomes complicated. In addition, in the fabrication of the second patterned thin film, it is required to position the patterning mask precisely for the first patterned thin film. In this point of view, the total fabrication process also becomes complicated.

[Patent Document 1]
Japanese Patent Application Laid-open No. 9-96909

[Patent Document 2]
Japanese examined patent application No. 37-18015

[Patent Document 3]
Japanese unexamined patent application No. 6-242602

[Patent Document 4]
Japanese unexamined patent application No. 2000-63466

[Patent Document 5]
Japanese unexamined patent application No. 6-273934

SUMMARY OF THE INVENTION

It is an object of the present invention to provide a method for fabricating a mask, whereby another patterned thin film is positioned precisely for one patterned thin film, a method for fabricating a patterned thin film utilizing the fabricating method of mask, and a micro device with the patterned thin film.

It is another object of the present invention to provide a method for fabricating a mask, whereby a patterning process of thin film can be simplified, a method for fabricating a patterned thin film utilizing the fabricating method of mask, and a micro device with the patterned thin film.

For achieving the above objects, in the present invention, a film to be patterned is formed, and then, a laminated resist pattern with a T-shaped cross section is formed on the film. The laminated resist pattern is composed of a bottom resist pattern and a top resist pattern, and the surface area of the top resist pattern is larger than the surface area of the bottom resist pattern. Then, the surface area of the top resist pattern is increased after the film is patterned via the laminated resist pattern.

As mentioned above, in the present invention, since the intended mask is made of the laminated resist pattern composed of the bottom resist pattern and the top resist pattern, a minute patterned thin film can be formed easily. The bottom resist pattern and the top resist pattern may be made of their respective different resist materials. For example, the bottom resist pattern and the top resist pattern are made of their respective resist materials with different rates at development. In this case, the surface area of the bottom resist pattern can be smaller than the surface area of the top resist pattern, so that some undercuts can be formed at the bottom of the mask, which is suitable for the fabrication of a minute patterned thin film and the lift off technique.

The mask is formed T-shape in cross section due to the undercuts of the bottom resist pattern of the laminated resist pattern, so that a given thin film is patterned along the contour of the top resist pattern and larger in surface area than the bottom resist pattern, to complete a patterned thin film (first patterned thin film).

After the fabrication of the first patterned thin film, the surface area of the top resist pattern is increased. The mask is located above the first patterned thin film, and not be moved. That is, only the surface area of the top resist pattern is increased without movement.

In this case, when a given thin film is formed by means of film-forming technique via the mask, a second patterned thin film is formed of the thin film outside the first patterned thin film via a minute gap because the surface area of the top resist layer is increased. Since the mask is not moved through the fabrication process of the first patterned thin film and the second patterned thin film, the second patterned thin film can be positioned precisely for the first patterned thin film.

In addition, since the mask is not removed and another mask is not prepared, the fabrication process of the patterned thin films can be simplified.

In the present invention, the top resist layer may be made of a resist material with phenol-based hydroxide. In this case, the surface area of the top resist pattern can be increased by coating a water-soluble resin on the laminated resist pattern constituting the mask. The coating process may be carried out by means of spin coating.

The water-soluble resin may contain a crosslinking agent. In the use of the water-soluble resin without the crosslinking agent, the top resist pattern is expanded due to the shrinkage of the water-soluble resin.

In the use of the water-soluble resin with the crosslinking agent, the water-soluble resin is crosslinked over the top resist pattern with an acid as a catalyst which is diffused from the top resist pattern by thermal treatment, to form a membrane. As a result, the surface area of the top resist pattern can be increased due to the membrane.

The bottom resist pattern may be made of a resist material soluble in alkaline water solution.

A method for fabricating a patterned thin film according to the present invention includes a mask forming process and a patterned thin film forming process. In the mask forming process, an intended mask is formed by the above-mentioned process. In the patterned thin film forming process, intended patterned thin films are formed by utilizing the mask. Therefore, the fabrication steps of patterned thin film can be decreased.

Concretely, the fabricating method of patterned thin film is characterized by:

forming a first thin film to be patterned, forming, on the first thin film, a laminated resist pattern with a T-shaped cross section and composed of a bottom resist pattern and a top resist pattern, the surface area of the top resist pattern being larger than the surface area of the bottom resist pattern, patterning the first thin film via the laminated resist pattern, to form a first patterned thin film, increasing the surface area of the top resist pattern, and forming a second patterned thin film along a contour of the top resist pattern of the laminated resist pattern.

A micro device according to the present invention is characterized by including a first patterned thin film and a second patterned thin film which are formed by a fabricating method as mentioned above. As the micro device are exemplified a thin film magnetic head, a semiconductor device, a sensor with a thin film, an actuator with a thin film and the like. In the thin film magnetic head, the first patterned thin film constitutes a GMR film of the reading element. Moreover, the second patterned thin film constitutes a magnetic domain controlling film of the reading element.

BRIEF DESCRIPTION OF THE DRAWINGS

For a better understanding of this invention, reference is made to the attached drawings, wherein:

FIG. 11 is a cross sectional view showing one step in another method for fabricating a mask and a patterned thin film according to the present invention, FIG. 12 is a cross sectional view showing a step after the step shown in FIG. 11, FIG. 13 is a cross sectional view showing a step after the step shown in FIG. 12.

DETAILED DESCRIPTION OF PREFERRED EMBODIMENTS

FIGS. 1–9 are explanatory views for a method for fabricating a mask and a patterned thin film according to the present invention.

Figure 1:
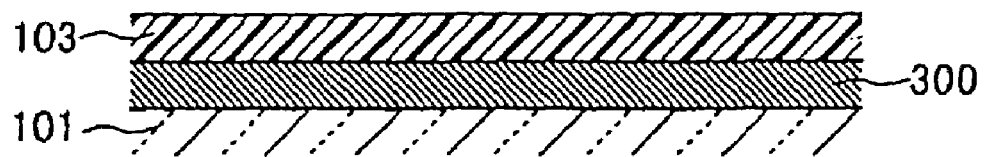
FIG. 1 is a cross sectional view showing one step in a method for fabricating a mask and a patterned thin film according to the present invention.

First of all, as shown in FIG. 1, a first resist layer 103 is formed on a film 300 to be patterned on a base 101 such as a substrate, and then, heated as occasion demands.

The first resist layer 103 is made of a resist material which enables some undercuts to be formed thereat easily. The undercuts may be formed by means of development, ashing or the combination thereof.

With the development, a soluble in an alkaline solution and larger in solution rate for the alkaline solution resist material than the one of a second resist layer to be formed later may be employed. Concretely, polymethylglutarimide (PMGI) may be exemplified as follows:

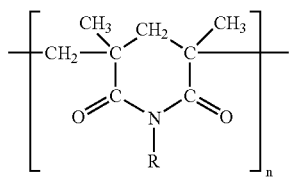

Herein, "R" represents H (hydrogen) or $CH_3$ (methyl group), and "n" represents an integral number not less than "0".

With the ashing, a lager in ashing rate resist material than the one of the second resist layer to be formed may be employed.

With the combination of the development and the ashing, a soluble in an alkaline solution and larger in ashing rate resist material than the one of the second resist layer to be formed later may be employed.

In this embodiment, the undercuts will be made in the first resist layer by means of development, hereinafter.

Figure 2:
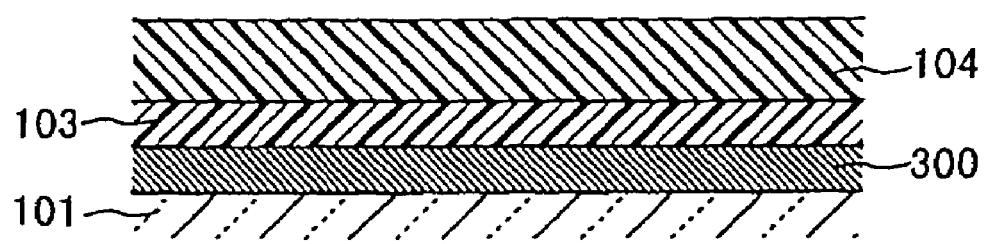
FIG. 2 is a cross sectional view showing a step after the step shown in FIG. 1.

After the step shown in FIG. 1, as shown in FIG. 2, the second resist layer 104 is formed on the first resist layer 103. The second resist layer 104 is preferably made mainly of a resist material with phenol-based hydroxide. Concretely, as the resist material of the second resist layer 104 may be exemplified the following resist:

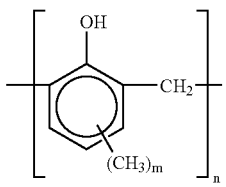

Herein, "m" represents an integral number within 1–3, and "n" represents an integral number not less than "0".

As the resist material of the second resist layer may be also exemplified the following resist:

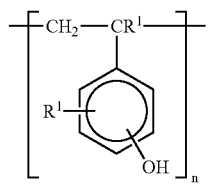

Herein, "$R^1$" represents H (hydrogen) or $CH_3$ (methyl group), and "n" represents an integral number not less than "0".

As the phenol-based material may be exemplified an NQD-novolak resist (naphthoquinonediazide-novolak resist), an integral type NGD-novolak resist, an integral type hydrophobic NQD-novolak resist and a chemically amplified resist with polyhydroxystyrene.

Figure 3:
FIG. 3 is a cross sectional view showing a step after the step shown in FIG. 2.
Figure 3:
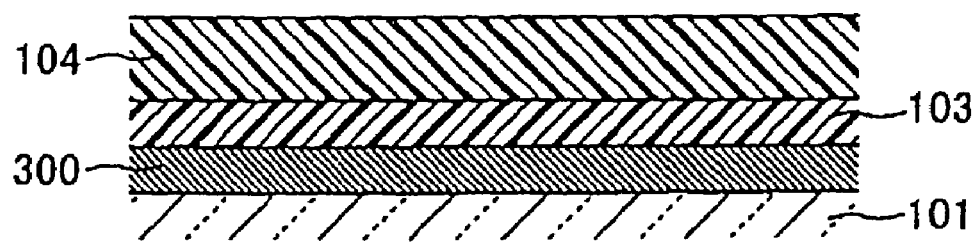

Then, as shown in FIG. 3, the second resist layer 104 is exposed via a mask 105 to form a patterning latent image thereon. The exposure may be carried out with ultraviolet ray, excimer laser beam, electron beam and the like. With the use of electron beam, the exposure may be carried out without the mask 105 to form a patterning latent image directly. If necessary, the second resist layer 104 is heated after the exposure.

Figure 4:
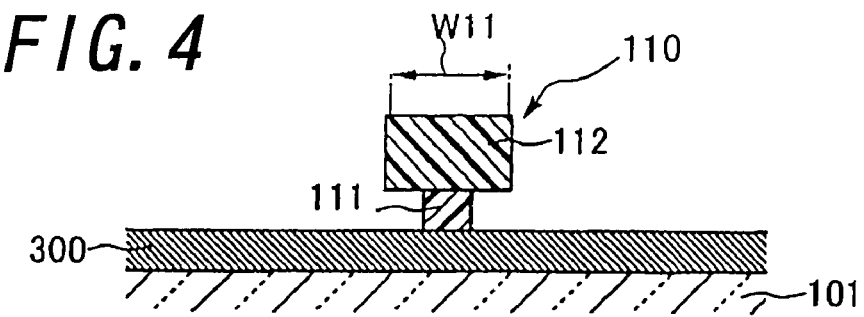
FIG. 4 is a cross sectional view showing a step after the step shown in FIG. 3.

Then, the second resist layer 104 is developed, and the first resist layer 103 is partially dissolved. After the development, the first resist layer 103 and the second resist layer 104 are washed with water and dried, to form a laminated resist pattern 110 with a T-shaped cross section as a mask composed of a top resist pattern 112 and a bottom resist pattern 111, as shown in FIG. 4. In this case, some undercuts are made at the bottom resist pattern 111. In the laminated resist pattern 110, the width of the second resist layer 112 is defined by "W1". The development is preferably carried out with an alkaline water solution such as tetramethylammoniumhydroxide (TMAH).

Figure 5:
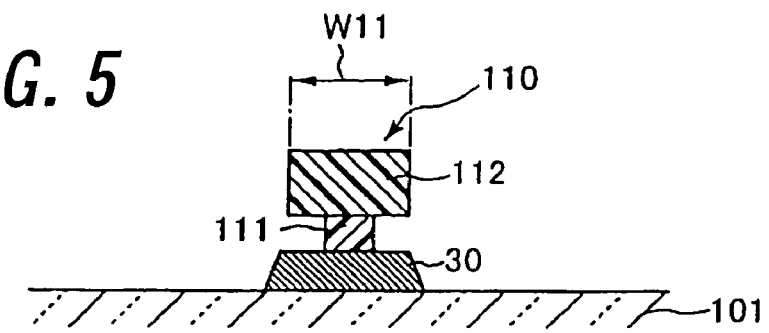
FIG. 5 is a cross sectional view showing a step after the step shown in FIG. 4.

Then, as shown in FIG. 5, the film 300 is etched via the laminated resist pattern 110 by means of milling, reactive ion etching (RIE) or the like to form a first patterned thin film 30.

Figure 6:
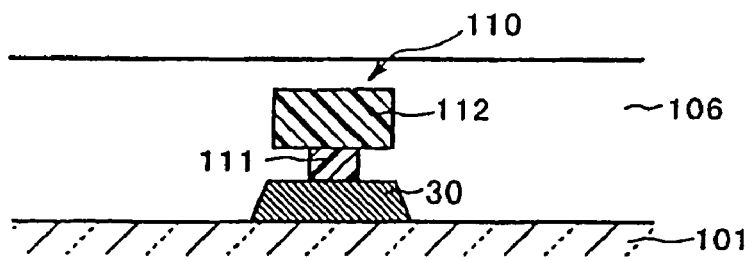
FIG. 6 is a cross sectional view showing a step after the step shown in FIG. 5.

Then, as shown in FIG. 6, a water-soluble resin 106 is coated over the laminated resist pattern 110 by means of spin coating or the like, and heated as occasion demands.

Figure 7:
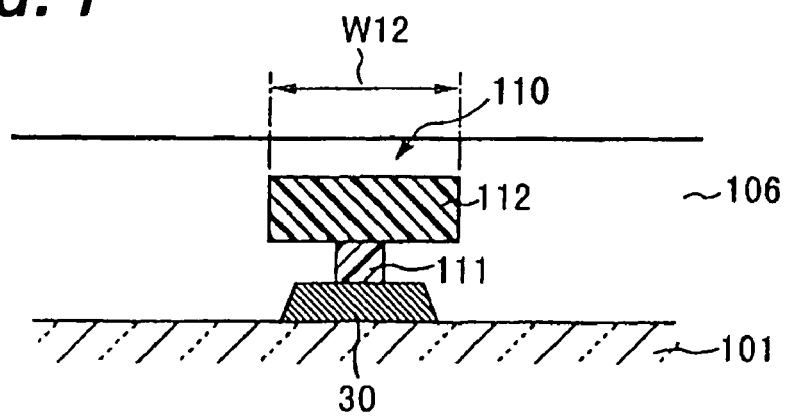
FIG. 7 is a cross sectional view showing a step after the step shown in FIG. 6.
Figure 8:
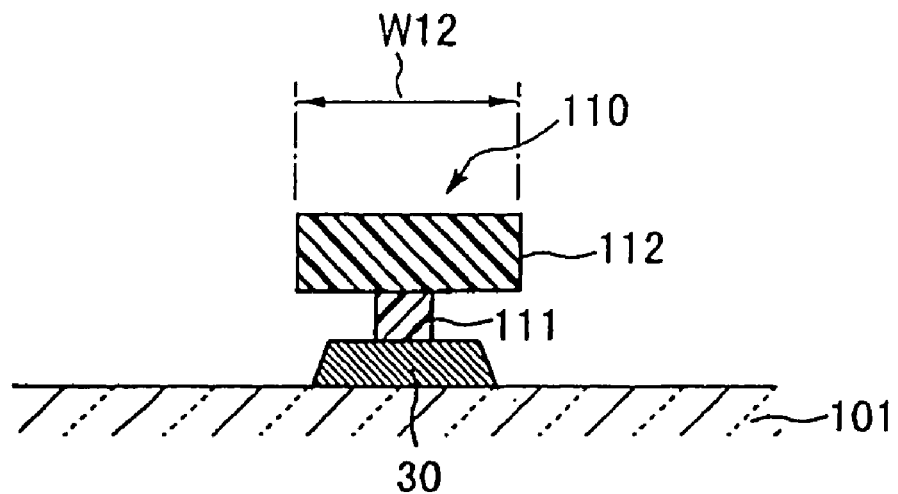
FIG. 8 is a cross sectional view showing a step after the step shown in FIG. 7.

In this case, the top resist pattern 112 is expanded due to the shrinkage of the water-soluble resin 106, so that the width of the top resist pattern 112 is increased to W12 from W11, as shown in FIG. 7 (see, FIGS. 4 and 5).

The water-soluble resin may be made mainly of at least one selected from the group consisting of poly(acrylic acid), poly(vinyl acetal), poly(vinylpyrrolidone), poly(vinyl alcohol), polyethylene imine, polyethylene oxido, styrene-maleic anhydride copolymer, poly(vinyl amine), oxazoline group-containing water-soluble resin, water-soluble melamine resin, water-soluble urea resin, alkid resin, and sulfone amide, the combination thereof and the salt thereof.

Thereafter, the water-soluble resin 106 is removed to form the laminated resist pattern 110 of which the surface area of the top resist pattern 112 is enlarged to W12 from W11 (see, FIG. 5).

The above-mentioned steps belong to the fabricating method of mask of the present invention. In the fabricating method of patterned thin film, a given patterning process will be carried out by utilizing the laminated resist pattern 110 as the mask. The micro device of the present invention is constructed of the resultant patterned thin films as mentioned below. In the fabricating method of patterned thin film, a second patterned thin film is formed in addition to the first patterned thin film 30 via a minute gap therebetween.

Figure 9:
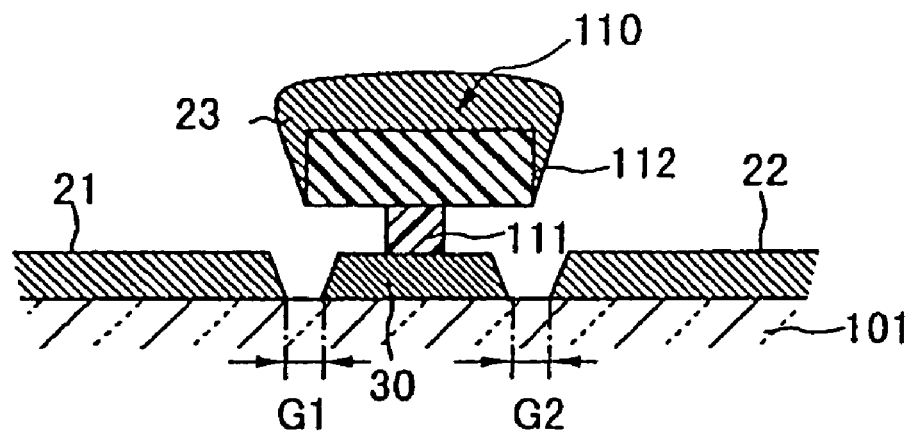
FIG. 9 is a cross sectional view showing a step after the step shown in FIG. 8.

First of all, as shown in FIG. 9, second thin films 21 and 22 are formed by means of film forming technique such as sputtering or CVD via the laminated resist pattern 110 which is not removed from on the first patterned thin film 30. In this case, some debris 23 is attached on the top resist pattern 112 of the laminated resist pattern 110.

Figure 10:
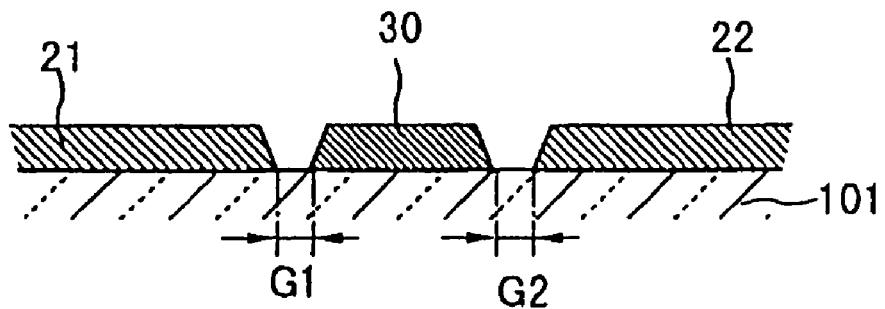
FIG. 10 is a cross sectional view showing a step after the step shown in FIG. 9.

Then, as shown in FIG. 10, the laminated resist pattern 110 is removed with acetone or the like, to complete the first patterned thin film 30 and the second patterned thin films 21, 22.

In the fabrication of the second patterned thin films 21 and 22, the laminated resist pattern 110 is not removed and remains on the first patterned thin film 30, and only the width (surface area) of the top resist pattern 112 is enlarged.

In the present invention, since the second patterned thin films 21 and 22 are formed along the contour of the top resist pattern 112 by means of film forming technique such as sputtering, they are formed at both sides of the first patterned thin film 30 by minute gaps of G1 and G2 due to the enlargement of the surface area of the top resist pattern 112.

In the fabrication of the second patterned thin films 21 and 22, since the laminated resist pattern 110 is not removed and remains on the first patterned thin film 30, it can be formed and positioned precisely for the first patterned thin film 30.

Moreover, in the fabrication of the second patterned thin films 21 and 22, since it is only required to expand the top resist pattern of the laminated resist pattern without the formation of another mask, the second patterned thin films 21 and 22 can be formed simply.

In the above-mentioned embodiment relating to FIGS. 1–10, although the water-soluble resin 106 without a crosslinking agent therein is employed, a water-soluble resin with a crosslinking agent therein may be employed, as mentioned later.

FIGS. 11–16 are explanatory views for another method for fabricating a mask and a patterned thin film according to the present invention. First of all, the steps relating to FIGS. 1–5 are performed to form the laminated resist pattern 110 with the T-shaped cross section composed of the bottom resist pattern 111 and the top resist pattern 112 and to form the first patterned thin film 30 via the laminated resist pattern 110.

Then, as shown in FIG. 12, the water-soluble resin 106 with a crosslinking agent is coated over the laminated resist pattern 110, and heated as occasion demands.

Figure 14:
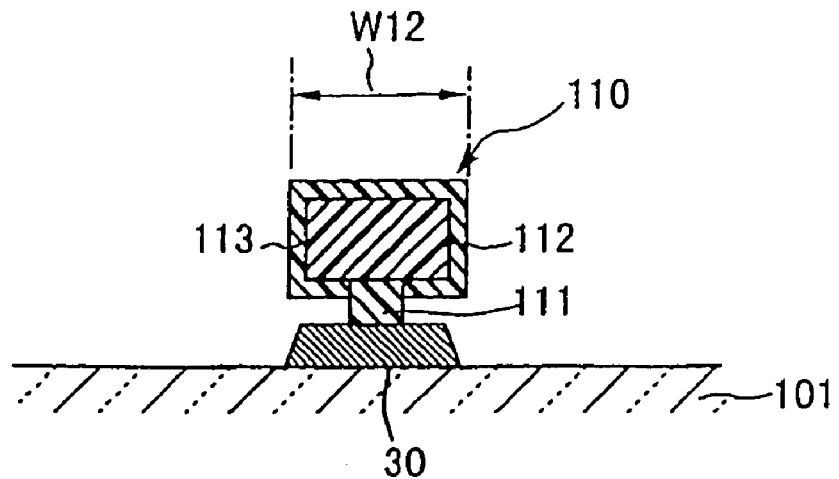
FIG. 14 is a cross sectional view showing a step after the step shown in FIG. 13.

Then, the water-soluble resin 106 is crosslinked over the top resist pattern 112 with an acid as a catalyst which is diffused from the top resist pattern 112 by thermal treatment, to form a membrane 113 as shown in FIGS. 13 and 14. As a result, the width of the top resist pattern 112 can be increased to W12 from W11 due to the membrane 113 (see, FIG. 11).

The water-soluble resin 106 may contain a water-soluble crosslinking agent which is composed mainly of at least one selected from the group consisting of melamine derivative, urea derivative, benzoquanamine, glycoluril or the combination thereof.

As the melamine derivative are exemplified melamine, alkoxymethylenemelamine and the combination thereof.

As the urea derivative are exemplified urea, alkoxymethyleneurea, N-alkoxymethyleneurea, ethyleneurea, etyleneurea carboxylic acid or the combination thereof.

The above-mentioned steps belong to the fabricating method of mask of the present invention. In the fabricating method of patterned thin film, a given patterning process will be carried out by utilizing the laminated resist pattern 110 as the mask. The micro device of the present invention is constructed of the resultant patterned thin films as mentioned below.

Figure 15:
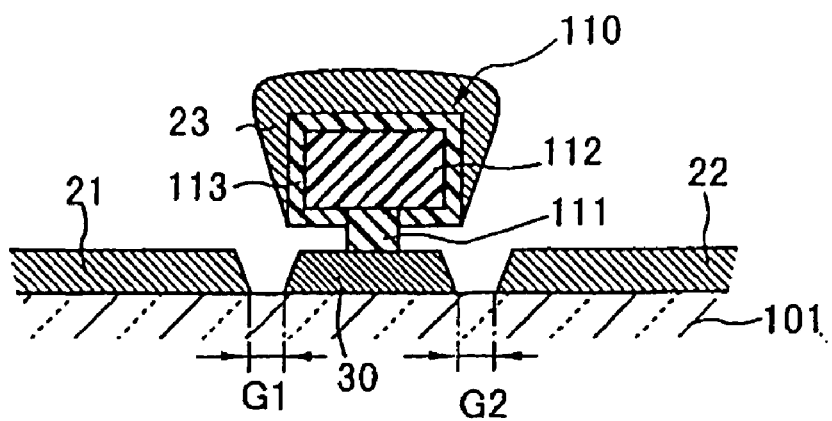
FIG. 15 is a cross sectional view showing a step after the step shown in FIG. 14.

First of all, as shown in FIG. 15, the second thin films 21 and 22 are formed by means of film forming technique such as sputtering or CVD via the laminated resist pattern 110 which is not removed from on the first patterned thin film 30. In this case, some debris 23 is attached on the top resist pattern 112 of the laminated resist pattern 110.

Figure 16:
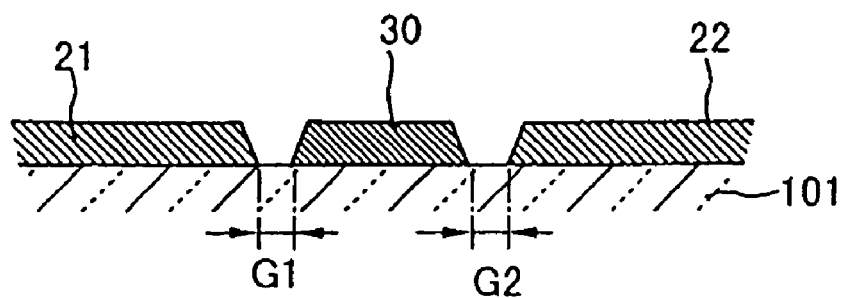
FIG. 16 is a cross sectional view showing a step after the step shown in FIG. 15.

Then, as shown in FIG. 16, the laminated resist pattern 110 is removed with acetone or the like, to complete the first patterned thin film 30 and the second patterned thin films 21, 22.

In the fabrication of the second patterned thin films 21 and 22, the laminated resist pattern 110 is not removed and remains on the first patterned thin film 30, and only the width (surface area) of the top resist pattern 112 is enlarged.

In the present invention, since the second patterned thin films 21 and 22 are formed along the contour of the top resist pattern 112 by means of film forming technique such as sputtering, they are formed at both sides of the first patterned thin film 30 by minute gaps of G1 and G2 due to the enlargement of the surface area of the top resist pattern 112.

In the fabrication of the second patterned thin films 21 and 22, since the laminated resist pattern 110 is not removed and remains on the first patterned thin film 30, it can be formed and positioned precisely for the first patterned thin film 30.

Moreover, in the fabrication of the second patterned thin films 21 and 22, since it is only required to expand the top resist pattern of the laminated resist pattern without the formation of another mask, the second patterned thin films 21 and 22 can be formed simply.

Next, the above-mentioned fabricating method of mask and patterned thin film will be applied to a thin film magnetic head with a giant magneto-resistive effective element (hereinafter, called as a "GMR" element) as a reading head. As the GMR element are exemplified a spin valve film (hereinafter, called as a "SV film") and a ferromagnetic tunnel junction element (hereinafter, called as a "TMR element").

Figure 17:
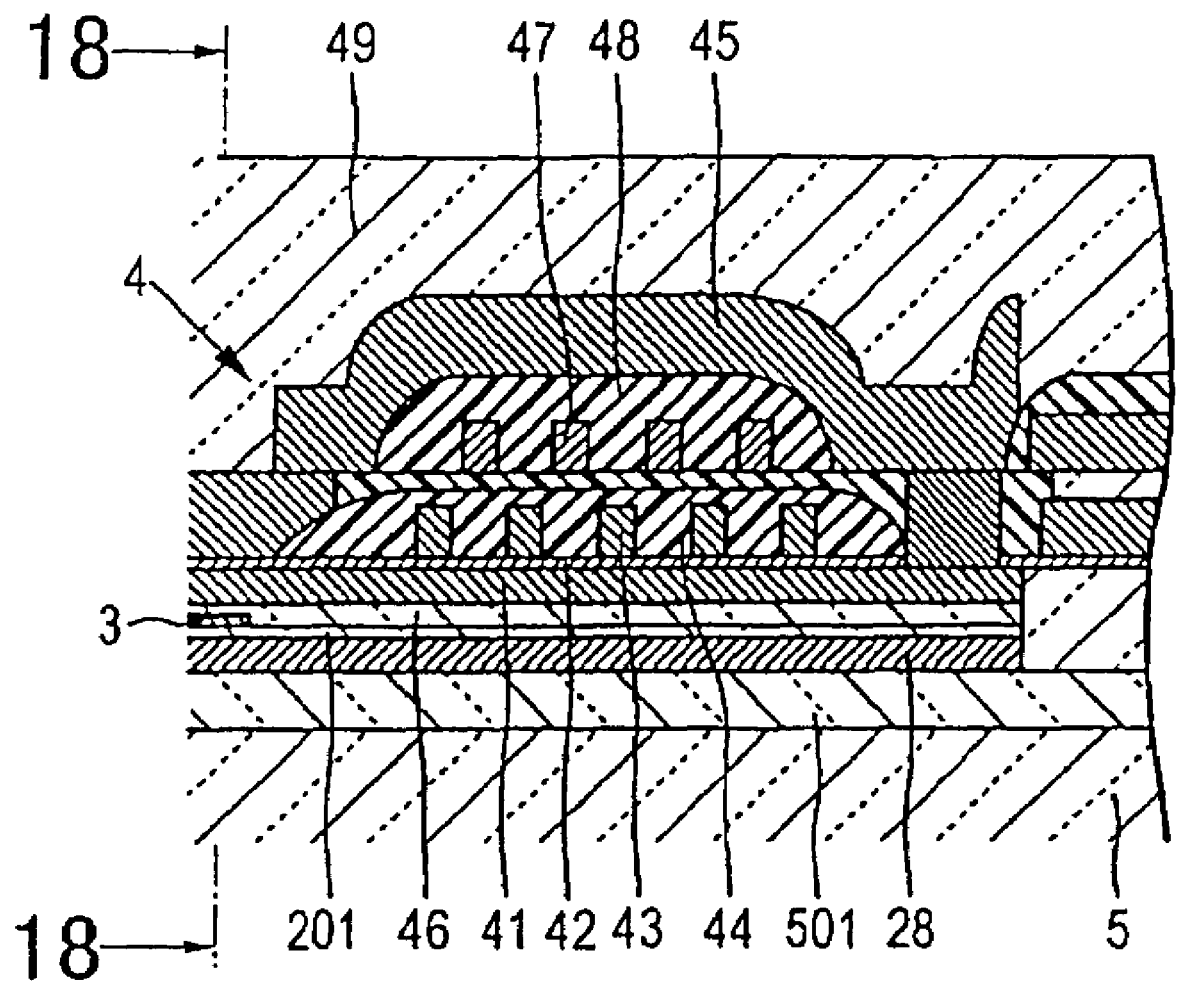
FIG. 17 is a cross sectional view showing a portion of a thin film magnetic head to which the fabricating method of the present invention is applied.
Figure 18:
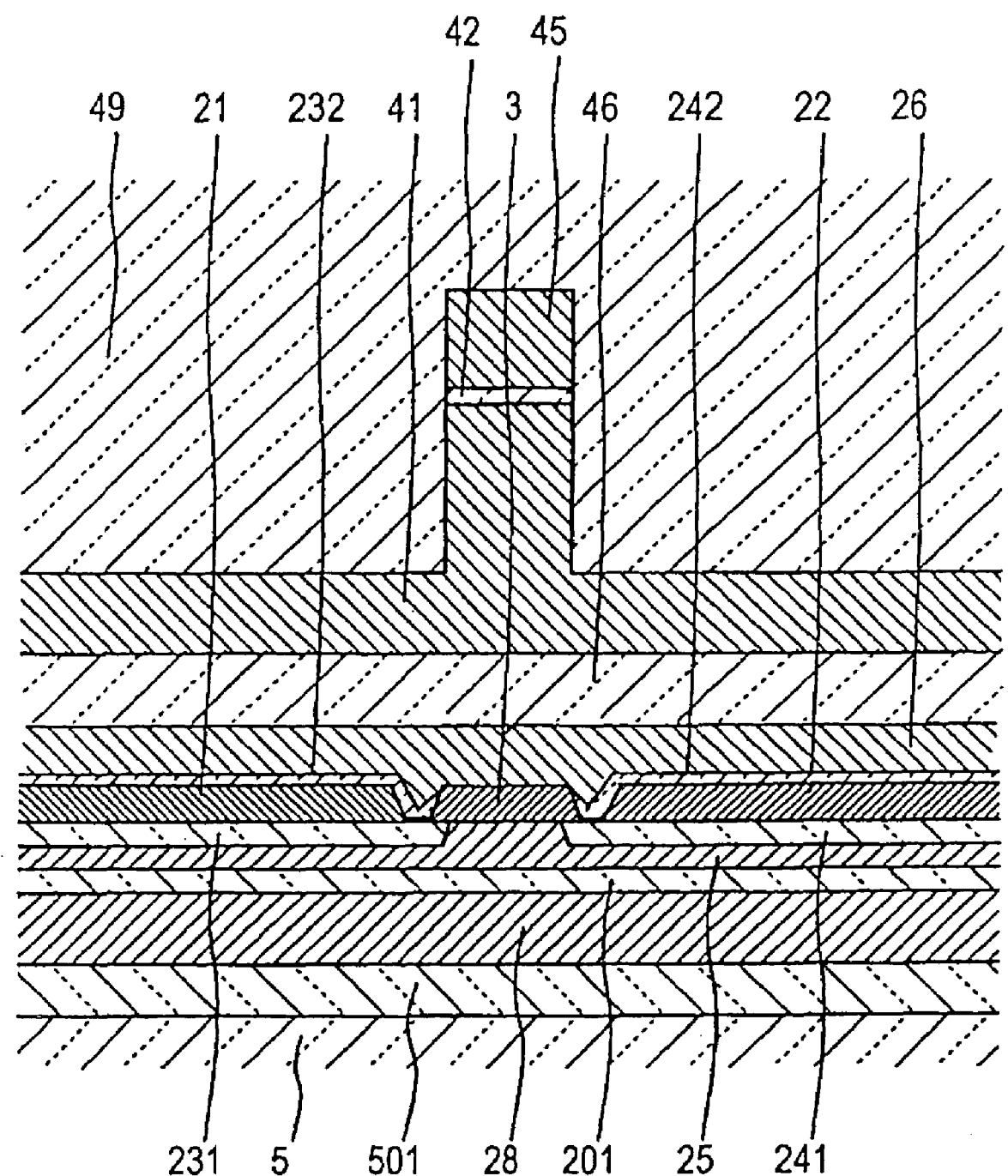
FIG. 18 is an enlarged cross sectional view showing the thin film magnetic head, taken on line 18—18.

FIG. 17 is an enlarged cross sectional view showing a portion of a thin film magnetic head, and FIG. 18 is also an enlarged cross sectional view of the thin film magnetic head shown in FIG. 17, taken on line "18—18". In a practical operation, a plurality of thin film magnetic heads are fabricated and mounted on a wafer made of AlTiC ($Al_2O_3$—TiC) or the like.

In the thin film magnetic head shown in FIGS. 17 and 18, electro-magnetic conversion elements 3 and 4 are incorporated, which are mounted on a base 5 made of AlTiC ($Al_2O_3$—TiC) to constitute a wafer. The substrate 5 functions as a slider.

On the base 5 are formed an insulating layer 501 made of alumina ($Al_2O_3$), $SiO_2$ or the like with a thickness within 1–5 μm.

The electromagnetic conversion elements 3 and 4 constitute a MR reading element 3 and a recording element 4, respectively. The MR element 3 includes a SV film or a TMR film. In the use of the SV film, the MR element 3 constitutes a CPP-GMR structure where a sense current is flowed perpendicular to the SV film. In the use of the TMR film, a sense current is flowed inherently perpendicular to the TME film.

The recording element 4 is constructed of an inductive type magnetic conversion element, which is disposed near the MR element 3 and covered with a protective film 49.

The recording element 4 includes a bottom magnetic pole layer 41, a top magnetic pole layer 45, a recording gap layer 42, and thin film coils 43, 47. The bottom magnetic pole layer 41 functions as a top shielding layer 41.

The bottom magnetic pole layer 41 is formed on a top shielding gap layer 46, and magnetically joined with the top magnetic pole layer 45. The recording gap layer 42 is located between the bottom magnetic pole layer 41 and the top magnetic pole layer 45. The thin film coils 43 and 44 are provided in the inner gap formed between the bottom magnetic pole layer 41 and the top magnetic pole layer 45. The inner gap and thus, the thin film coils 43 and 44 are embedded by an insulating film 48. Therefore, the thin film coils 43 and 44 are electrically insulated. The recording head 4 is covered with a protective film 49 made of alumina or the like.

Figure 19:
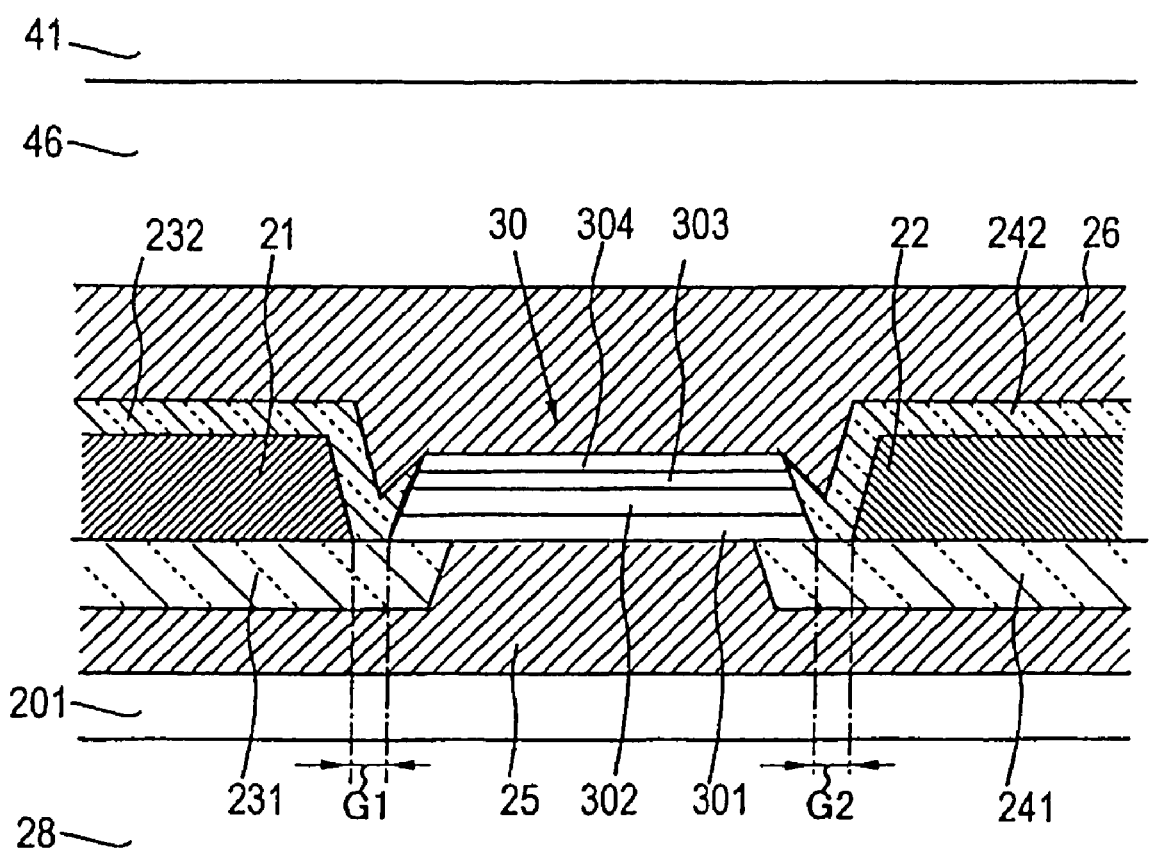
FIG. 19 is an enlarged cross sectional view showing the GMR element of the thin film magnetic head shown in FIG. 18.

The MR element 3 includes a GMR film 30, electrode films 25 and 26, a bottom shielding film 28, a bottom shielding gap layer 201 and a top shielding gap layer 46, as shown in FIGS. 18 and 19. Moreover, the MR element 3 includes magnetic domain controlling films 21, 22, insulating films (231, 232), (241,242).

The bottom shielding layer 28 is made of permalloy (NiFe) or the like, and formed in a thickness of about 3 μm on the insulating film 501 by means of sputtering, plating or the like.

The bottom shielding gap layer 201 is formed in a thickness of within 10–200 nm on the bottom shielding layer 28. The bottom shielding gap layer 201 is made of aluminum oxide or the like.

The bottom electrode film 25 is formed in a thickness of several ten nm on the bottom shielding gap layer 201. The center of the bottom electrode film 25 is protruded to be contacted with the GMR film 30. Both edges of the bottom electrode film 25 are embedded by the insulating films 231 and 241. The surface level of the center protrusion of the bottom electrode film 25 is equal to the surface level of the insulating films 231 and 241. The insulating films 231 and 241 are made of aluminum oxide ($Al_2O_3$), $SiO_2$ or the like.

The GMR film 30 includes a free layer 301, a non-magnetic layer 302 and a pinned layer 303 which are successively formed and stacked. Then, an anti-ferromagnetic layer 304 is formed on the pinned layer 303. The magnetization of the pinned layer 303 is fixed by the bonding with exchange interaction to the anti-ferromagnetic layer 304.

The free layer 301, the non-magnetic layer 302, the pinned layer 303 and the anti-ferromagnetic layer 304 are made of materials commercially available by means of a conventional technique. For example, the free layer 301 and the pinned layer 303 are made of NiFe, NiFeCo, CoFe or the like, and the anti-ferromagnetic layer 304 is made of FeMn, MnIr, NiMn, CrMnPt or the like.

The non-magnetic layer 302 is made of a conductive material mainly composed of Cu if the SV film is employed, and made of an insulating oxide such as aluminum oxide if the TMR film is employed. The top electrode film 26 is adjacent to the anti-ferromagnetic layer 304, and the bottom electrode film 25 is adjacent to the free layer 301.

The magnetic controlling films 21 and 22 are provided at both sides of the GMR film 30 by the gaps of G1 and G2 corresponding to the thicknesses of the insulating films 232 and 242 (see, FIG. 19). The magnetic domain controlling films 21 and 22 control the magnetic domain of the free layer 301. In order to enhance the controllability of the films 21 and 22 for the GMR film 30, the gaps G1 and G2 are set as small as possible only if the magnetic domain controlling films 21, 22 and the GMR film 30 are electrically insulated each other.

The spaces between the magnetic domain controlling films 21, 22 and the electrode films 25, 26 and between the magnetic domain controlling films 21, 22 and the GMR film 30 are embedded by the insulating films (231, 232), (241, 242), respectively. Concretely, the insulating films 231 and 241 are formed in layer between the magnetic domain controlling films 21, 22 and the electrode films 25, 26. The insulating films 232 and 242 are formed so as to embed the gaps G1 and G2 between the magnetic domain controlling films 21, 22 and the GMR film 30 (see, FIG. 19).

The top electrode film 26 is covered with the top shielding gap layer 46. The top shielding gap layer 46 is made of aluminum oxide in a thickness within 10–200 nm (minimum thickness) by means of sputtering or the like.

The top shielding layer 41 is made of permalloy (NiFe) or the like, and formed in a thickness of about 3 μm on the top shielding gap layer 46 by means of sputtering or plating. In this embodiment, the top shielding layer 41 also functions as a bottom magnetic layer of the recording element 4.

In the thin film magnetic head, the MR element 3 includes the GMR film 30 and the electrode films 25, 26 which are vertically adjacent to the GMR film 30. In this case, a sense current is flowed perpendicular to the GMR film 30. Therefore, the GMR film 30 is a SV film or a TMR film.

In the use of the SV film or the TMR film, although Barkhausen noise is made from the free layer 301, in this case, it may be reduced because the magnetic domain of the free layer 301 is controlled by the magnetic domain controlling films 21 and 22 formed at both sides of the GMR film 30.

As mentioned above, the insulating films 231 and 241 are formed in layer between the magnetic domain controlling films 21, 22 and the electrode films 25, 26. The insulating films 232 and 242 are formed so as to embed the gaps G1 and G2 between the magnetic domain controlling films 21, 22 and the GMR film 30 (see, FIG. 19). Therefore, no sense current is leaked from the electrode films 25, 26 and the GMR film 30 to the magnetic domain controlling films 21, 22.

The GMR element 3 is formed by utilizing the fabricating method of mask and patterned thin film of the present invention, as mentioned above. The forming process will be described hereinafter, with reference to FIGS. 20–37. The steps relating to FIGS. 20–31 are based on the steps relating to FIGS. 1–10, and the steps relating to FIGS. 32–37 are based on the steps relating to FIGS. 11–16.

Figure 20:
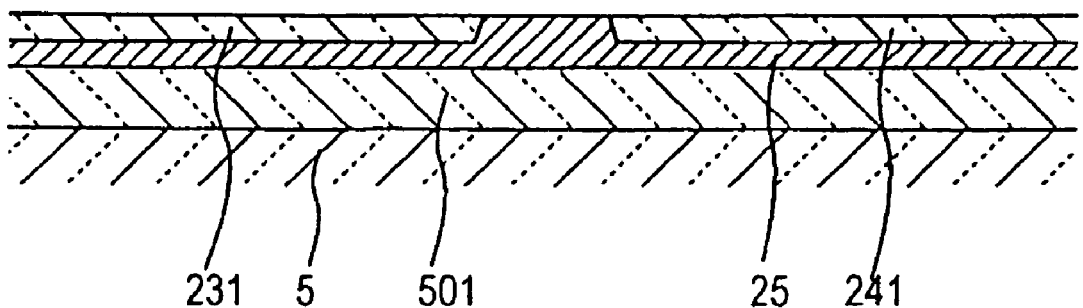
FIG. 20 is a cross sectional view showing one step in the fabrication of the thin film magnetic head shown in FIGS. 17–19.
Figure 21:
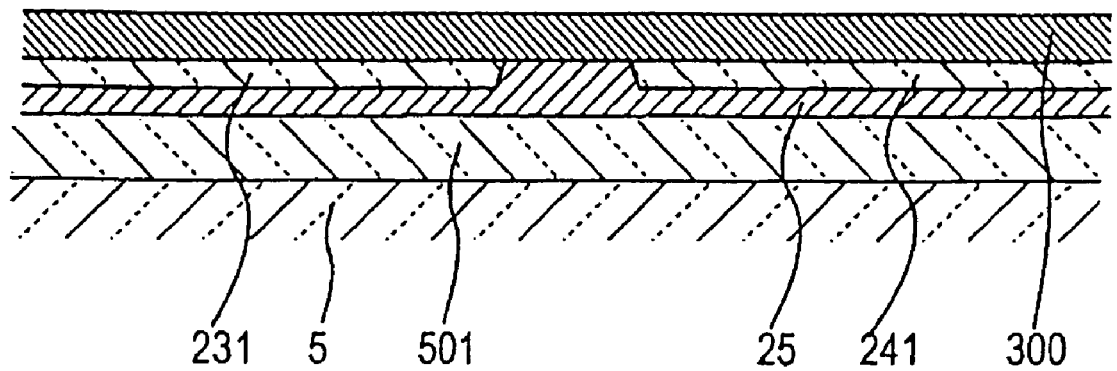
FIG. 21 is a cross sectional view showing a step after the step shown in FIG. 20.

First of all, as shown in FIG. 20, on the base 5 are successively formed the insulating layer 501, the bottom electrode layer 25, and the insulating films 231, 241, on which as shown in FIG. 21, the film 300 to be patterned to the GMR film 30 is formed. In reality, the film 300 is made of a multilayered film though in FIG. 21, the film 300 is made of a single-layered film.

Figure 22:
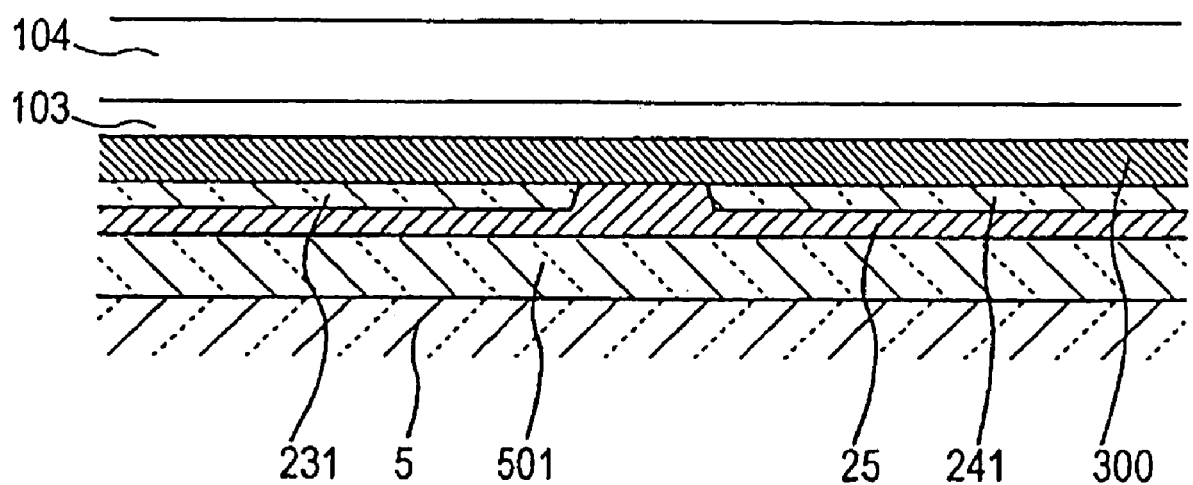
FIG. 22 is a cross sectional view showing a step after the step shown in FIG. 21.

Then, as shown in FIG. 22, the first resist layer 103 and the second resist layer 104 are successively formed on the film 300. The first resist layer 103 is made of the above-mentioned resist material, concretely PMGI. The second resist layer 104 is made of the resist material with phenol-based hydroxide as mentioned previously.

Figure 23:
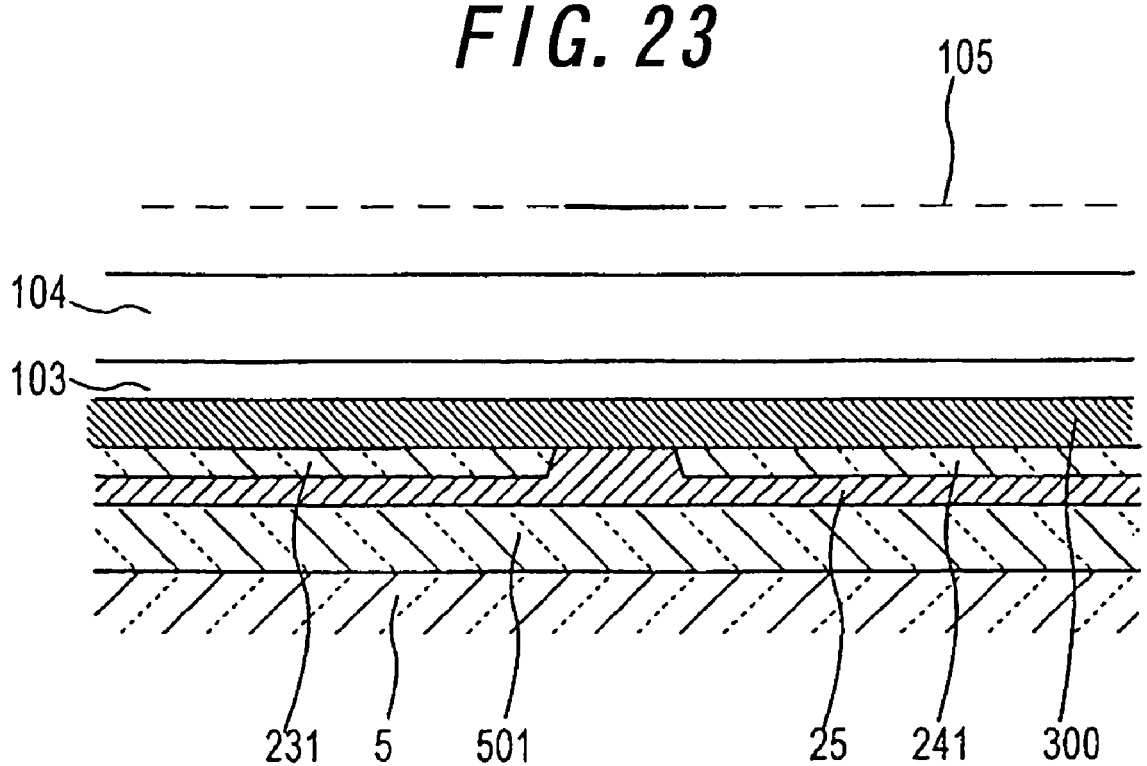
FIG. 23 is a cross sectional view showing a step after the step shown in FIG. 22.

Then, as shown in FIG. 23, the second resist layer 104 is exposed via the mask 105 to form the patterning latent image thereon. The mask 105 is disposed corresponding to the position of the GMR film 30 to be formed.

Then, the second resist layer 104 is developed, and the first resist layer 103 is partially dissolved. After the development, the first resist layer 103 and the second resist layer 104 are washed with water and dried, to form the laminated resist pattern 110 as the mask.

Figure 24:
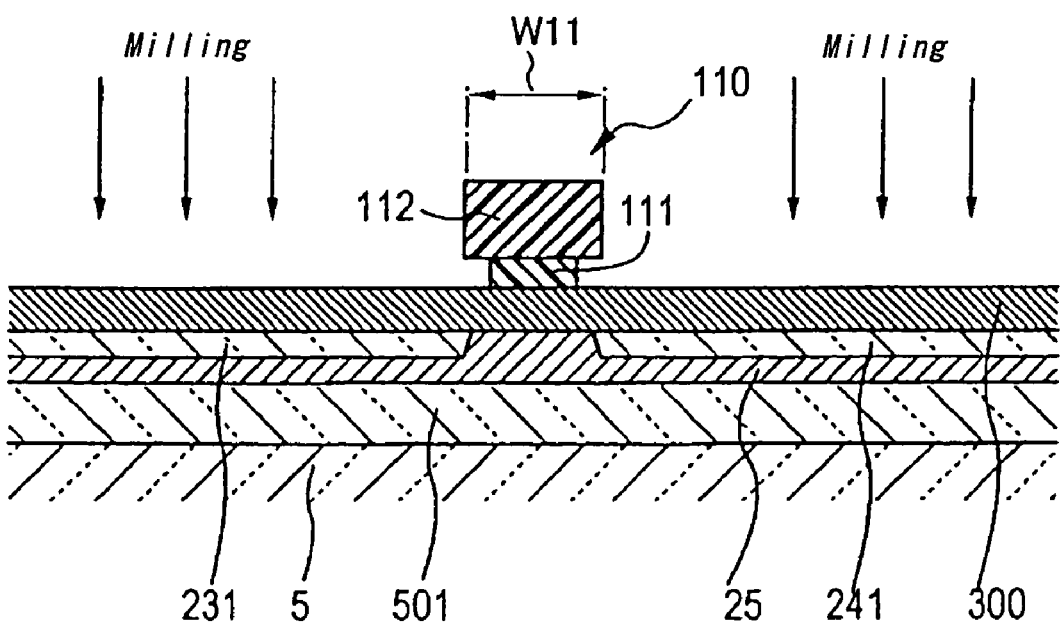
FIG. 24 is a cross sectional view showing a step after the step shown in FIG. 23.

The laminated resist pattern 110 has the T-shaped cross section, and is composed of the top resist pattern 112 and the bottom resist pattern 111, as shown in FIG. 24. In the laminated resist pattern 110, the width W11 of the second resist layer 112 is larger than the width of the first resist layer 111.

Figure 25:
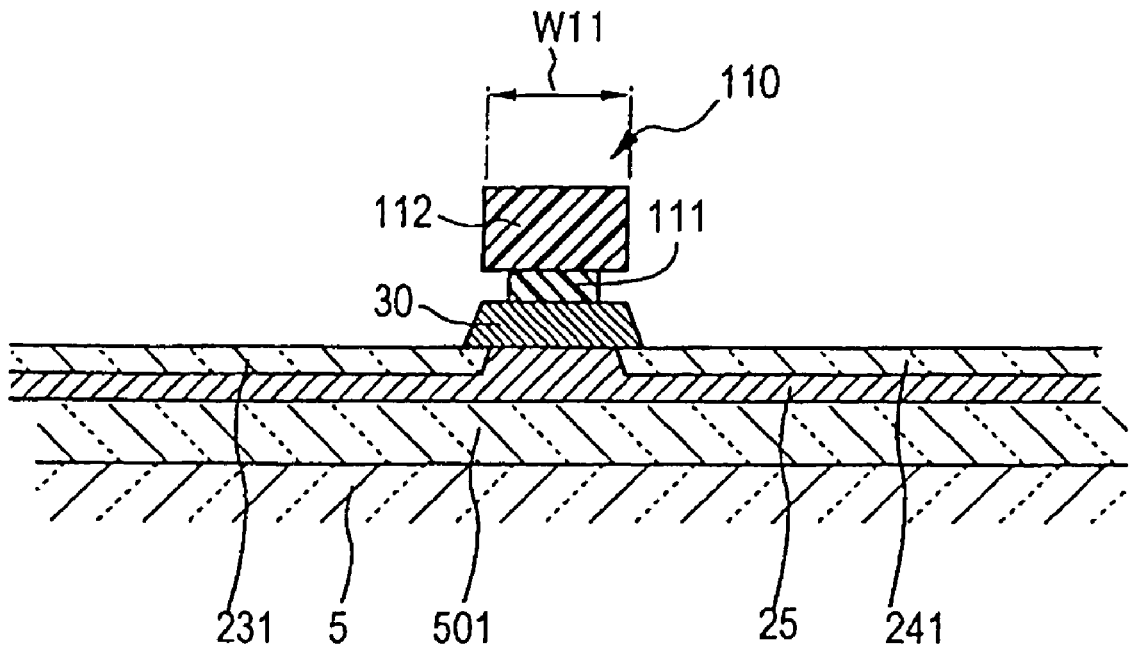
FIG. 25 is a cross sectional view showing a step after the step shown in FIG. 24.

Then, as shown in FIG. 25, the film 300 is etched via the laminated resist pattern 110 by means of ion milling or the like to form the GMR film 30 as the first patterned thin film.

Figure 26:
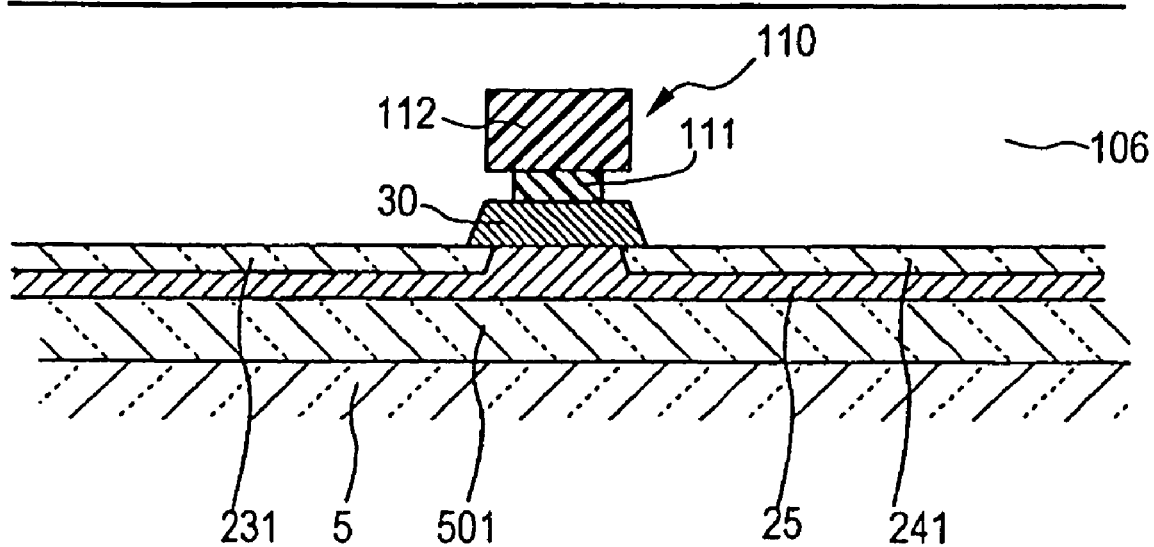
FIG. 26 is a cross sectional view showing a step after the step shown in FIG. 25.

Then, as shown in FIG. 26, the water-soluble resin 106 is coated over the laminated resist pattern 110 by means of spin coating or the like, and heated as occasion demands.

Figure 27:
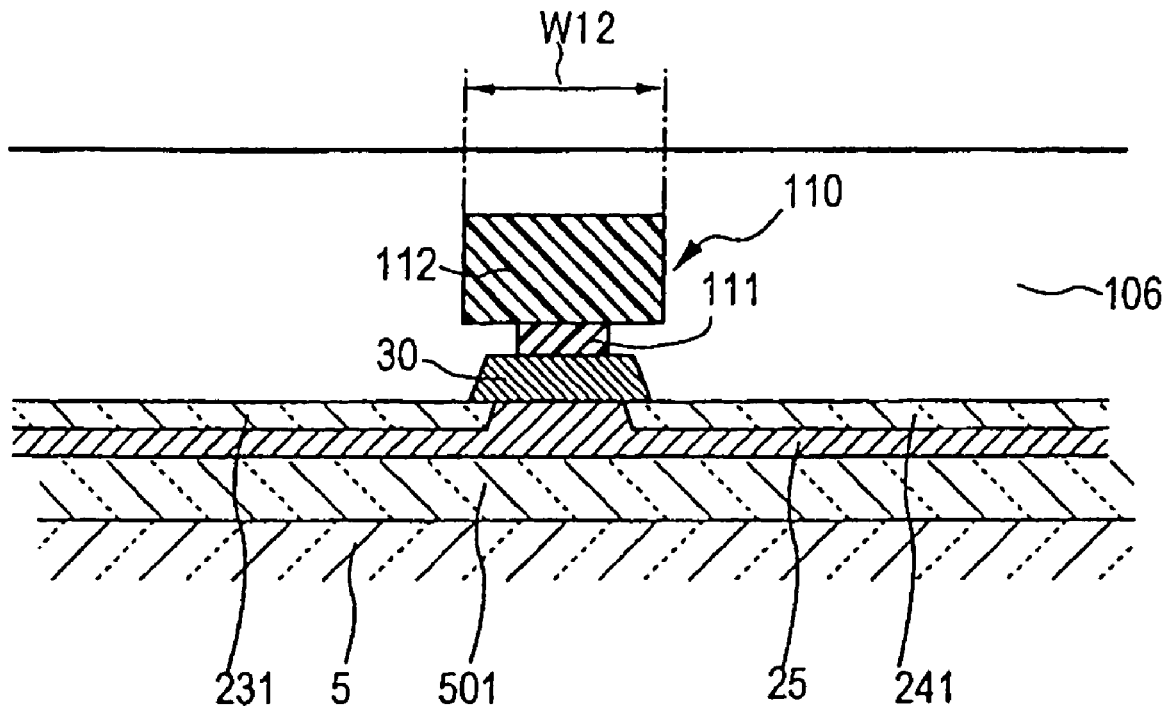
FIG. 27 is a cross sectional view showing a step after the step shown in FIG. 26.
Figure 28:
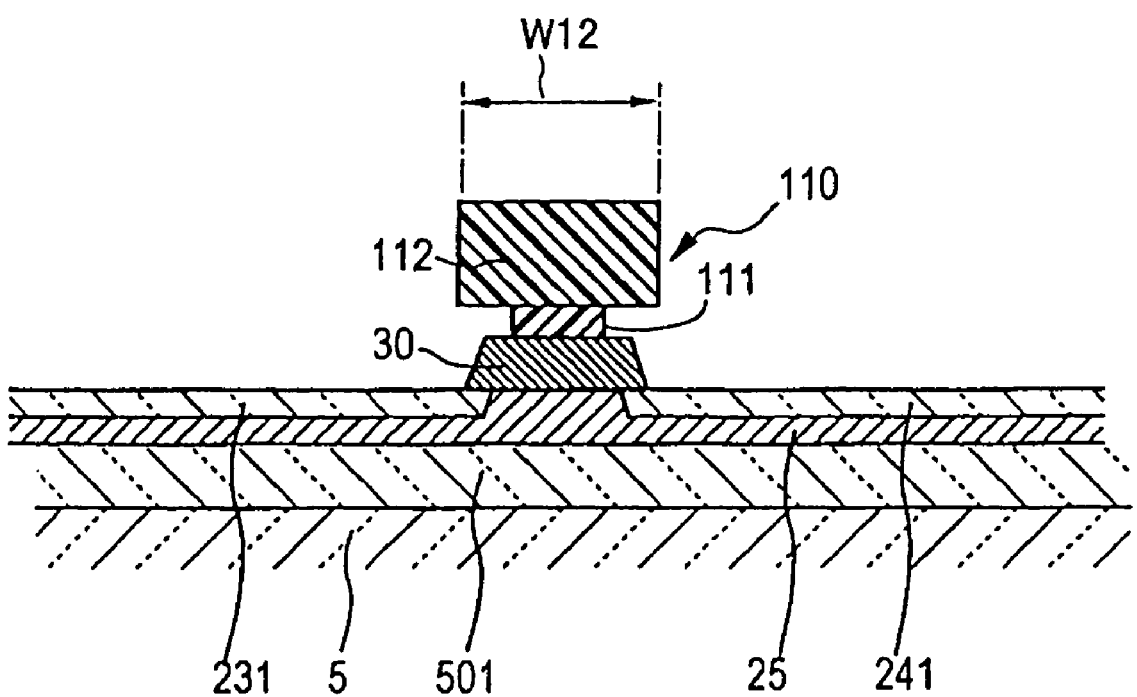
FIG. 28 is a cross sectional view showing a step after the step shown in FIG. 27.

In this case, the top resist pattern 112 is expanded due to the shrinkage of the water-soluble resin 106, so that the width of the top resist pattern 112 is increased to W12 from W11, as shown in FIG. 27 (also see, FIGS. 24 and 25). As a result, the surface area of the top resist pattern 112 is increased, compared with the previous surface area of the top resist pattern 112 with the water-soluble resin not coated.

Thereafter, the water-soluble resin 106 is removed with purified water to form the laminated resist pattern 110 of which the surface area of the top resist pattern 112 is enlarged to W12 from W11 (see, FIG. 25).

The above-mentioned steps belong to the fabricating method of mask of the present invention. In the fabricating method of thin film magnetic head, a given patterning process will be carried out by utilizing the laminated resist pattern 110 as the mask.

Figure 29:
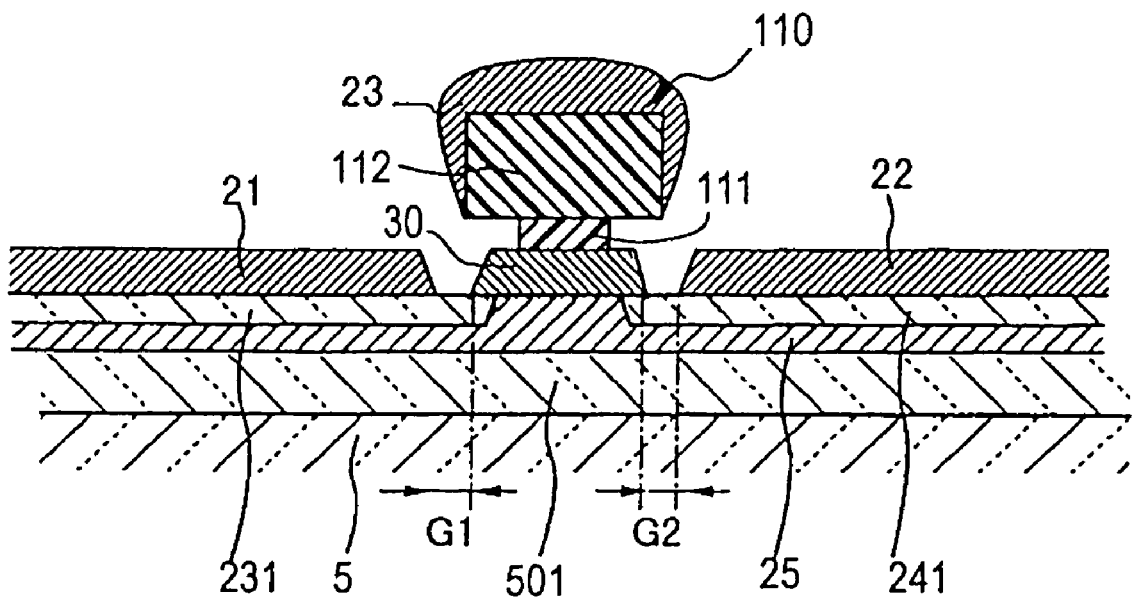
FIG. 29 is a cross sectional view showing a step after the step shown in FIG. 28.

First of all, as shown in FIG. 29, the magnetic domain controlling films 21 and 22 are formed by means of film forming technique such as sputtering or CVD via the laminated resist pattern 110 which is not removed from on the GMR film 30. In this case, some debris 23 is attached on the top resist pattern 112 of the laminated resist pattern 110.

In the fabrication of the magnetic domain controlling films 21 and 22, the laminated resist pattern 110 is not removed and remains on the first patterned thin film 30, and only the width (surface area) of the top resist pattern 112 is enlarged.

Therefore, since the magnetic domain controlling films 21 and 22 (second patterned thin films) are formed along the contour of the top resist pattern 112 by means of film forming technique such as sputtering, they are formed at both sides of the GMR film 30 (first patterned thin film) by minute gaps of G1 and G2 due to the enlargement of the surface area of the top resist pattern 112. In this case, since the laminated resist pattern 110 is not removed and remains on the GMR film 30, it can be formed and positioned precisely for the GMR film 30.

Moreover, since it is only required to expand the top resist pattern 112 of the laminated resist pattern 110 without the formation of another mask, the magnetic domain controlling films 21 and 22 can be formed simply, in addition to the GMR film 30.

Figure 30:
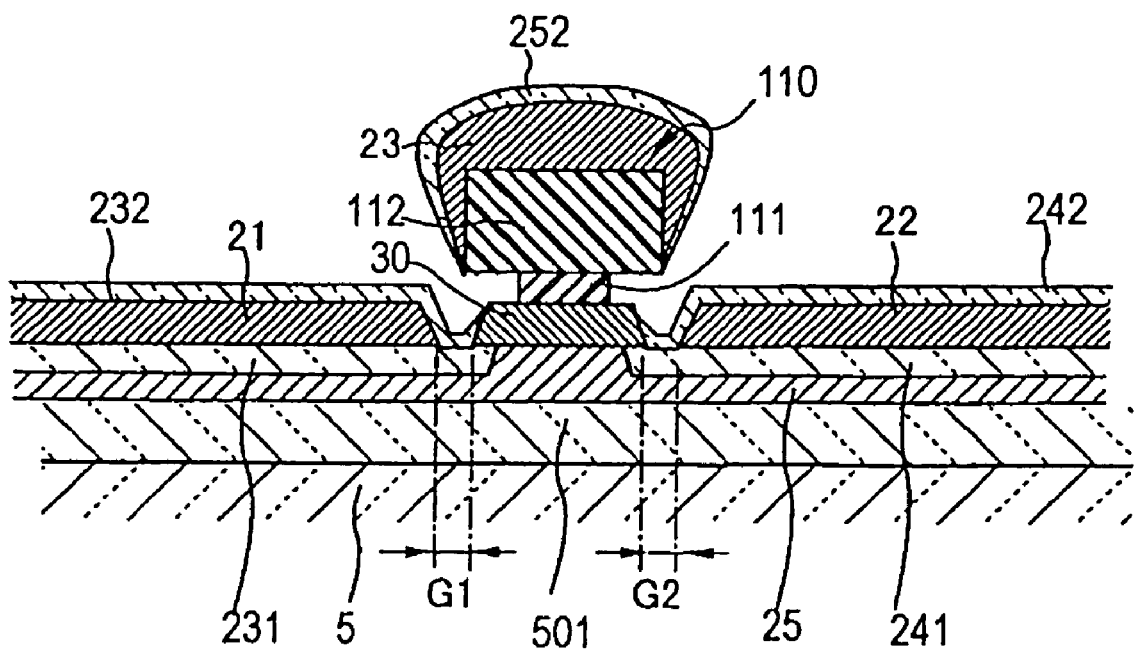
FIG. 30 is a cross sectional view showing a step after the step shown in FIG. 29.

Then, as shown in FIG. 30, the insulating films 232 and 242 are patterned by means of film forming technique such as sputtering or CVD so as to embed the gaps G1 and G2 between the GMR film 30 and the magnetic domain controlling films 21, 22. Due to the insulating films 232 and 242, the magnetic domain controlling films 21 and 22 are electrically insulated.

If the gaps G1 and G2 are set much smaller, the thicknesses of the insulating films 232 and 242 can be reduced sufficiently, so that the controllability of the magnetic domain controlling films 21 and 22 for the GMR film 30 can be enhanced.

Figure 31:
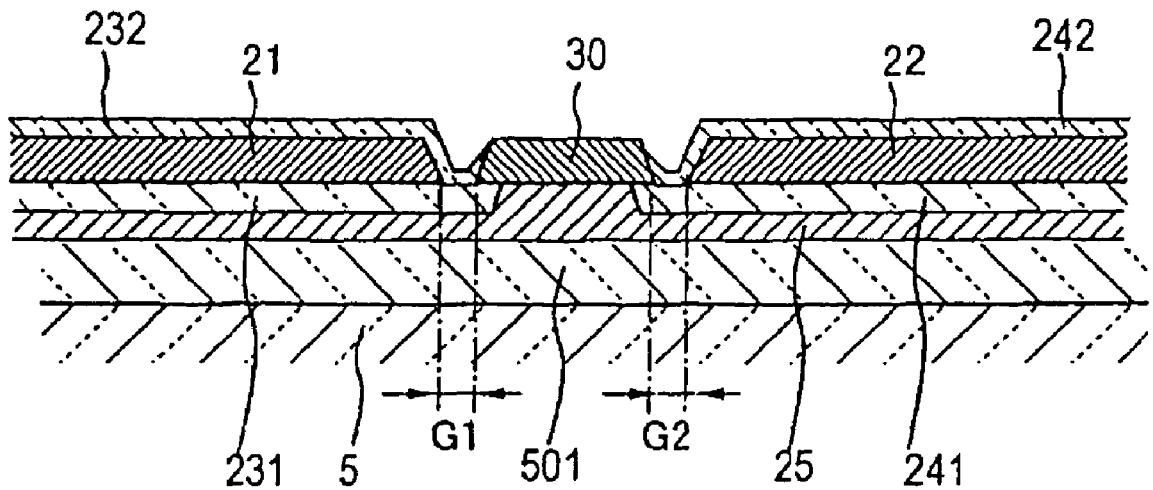
FIG. 31 is a cross sectional view showing a step after the step shown in FIG. 30.
Figure 32:
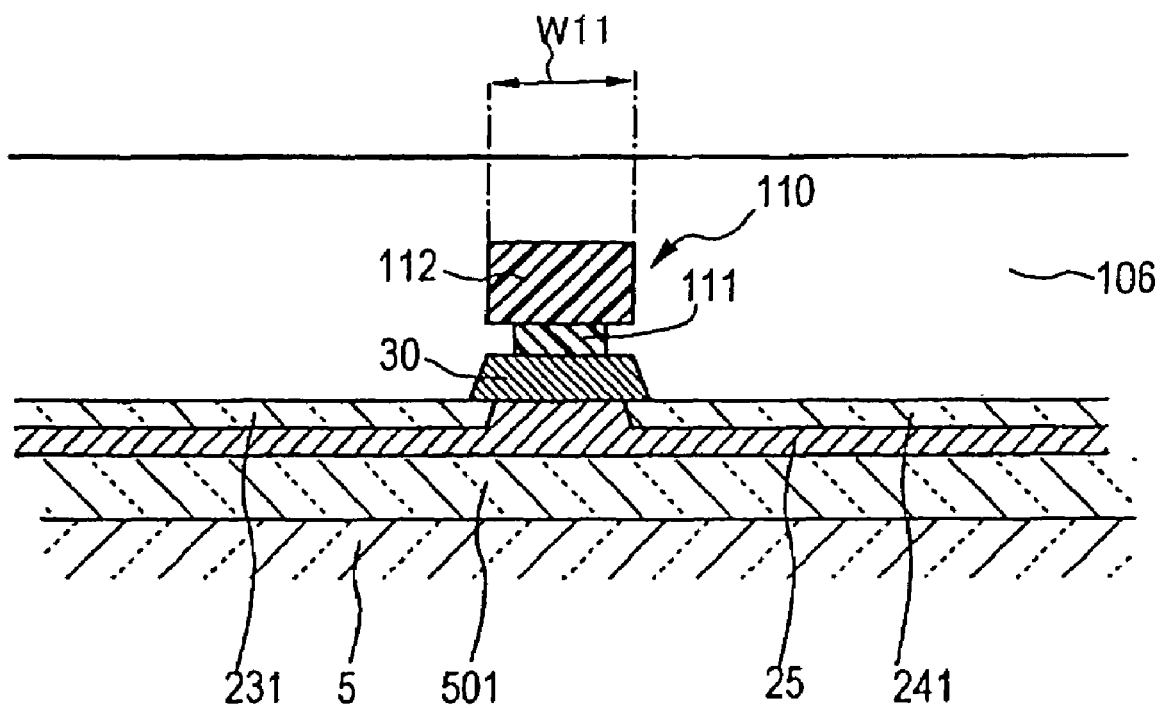
FIG. 32 is a cross sectional view showing one step in another fabrication of the thin film magnetic head shown in FIGS. 17–19.

Then, as shown in FIG. 31, the laminated resist pattern 110 is removed by means of lift off. Furthermore, the fabrication process of reading element and recording element will be carried out by means of a conventional technique.

Next, the above-mentioned process will be carried out by utilizing the water-soluble resin with the crosslinking agent, with reference to FIGS. 32–37.

First of all, the steps relating to FIGS. 20–25 are performed to form the laminated resist pattern 110 with the T-shaped cross section composed of the bottom resist pattern 111 and the top resist pattern 112 and to form the GMR film 30 (first patterned thin film) via the laminated resist pattern 110.

Figure 33:
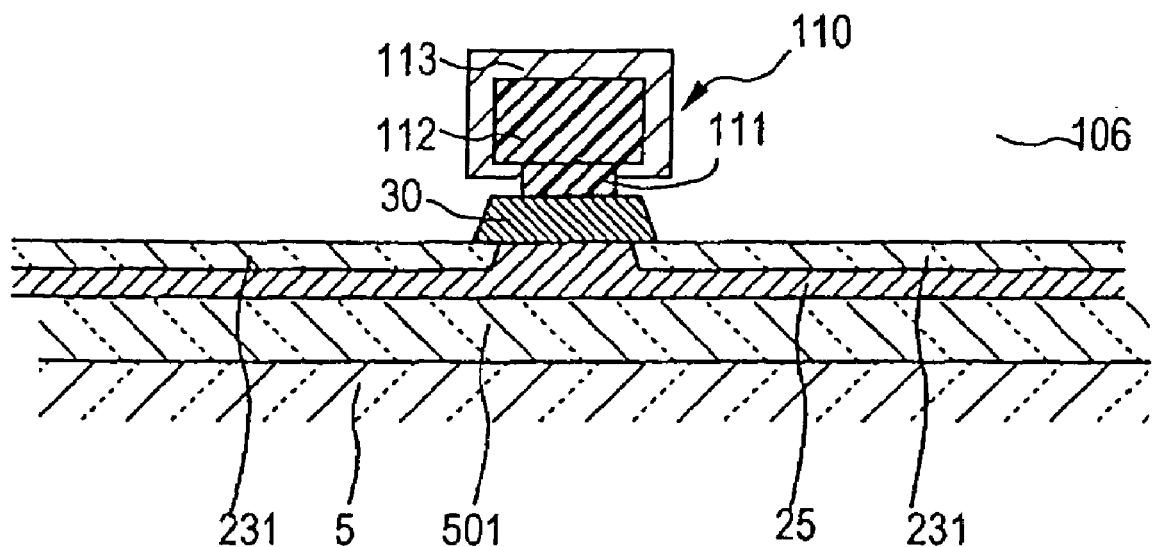
FIG. 33 is a cross sectional view showing a step after the step shown in FIG. 32.

Then, as shown in FIG. 33, the water-soluble resin 106 with the crosslinking agent therein is coated over the laminated resist pattern 110, and heated as occasion demands.

Figure 34:
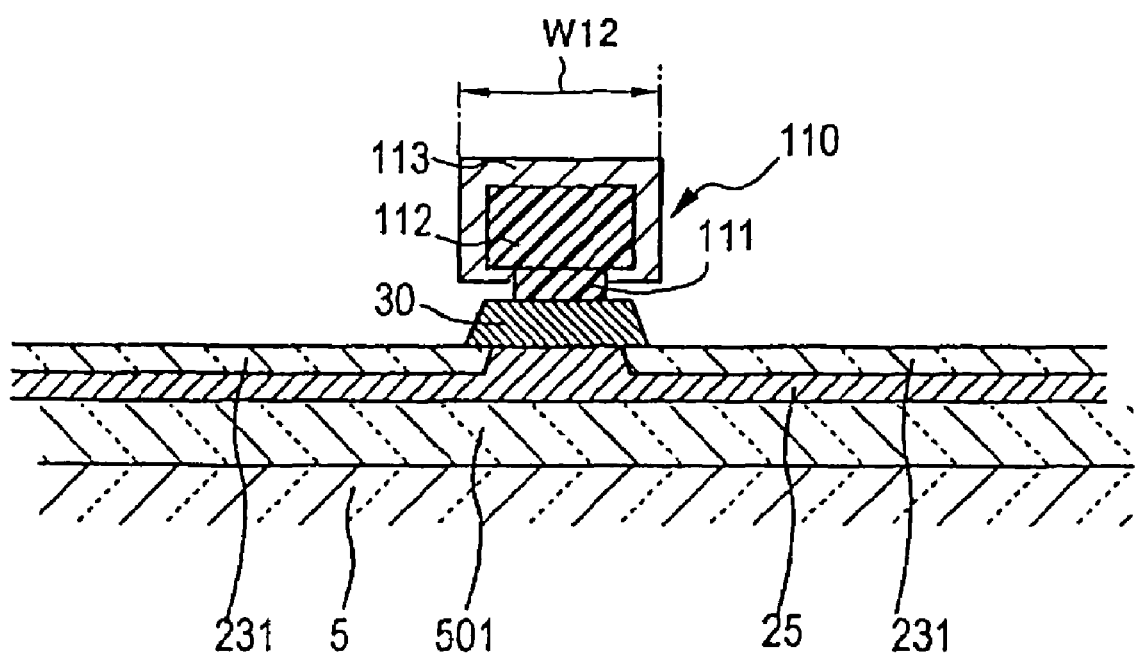
FIG. 34 is a cross sectional view showing a step after the step shown in FIG. 33.

Then, the water-soluble resin 106 is crosslinked over the top resist pattern 112 with the acid as a catalyst which is diffused from the top resist pattern 112 by thermal treatment, to form the membrane 113 as shown in FIGS. 33 and 34. As a result, the width of the top resist pattern 112 can be increased to W12 from W11 due to the membrane 113 (see, FIG. 32).

The above-mentioned steps belong to the fabricating method of mask of the present invention. In the fabricating method of thin film magnetic head, a given patterning process will be carried out by utilizing the laminated resist pattern 110 as the mask.

Figure 35:
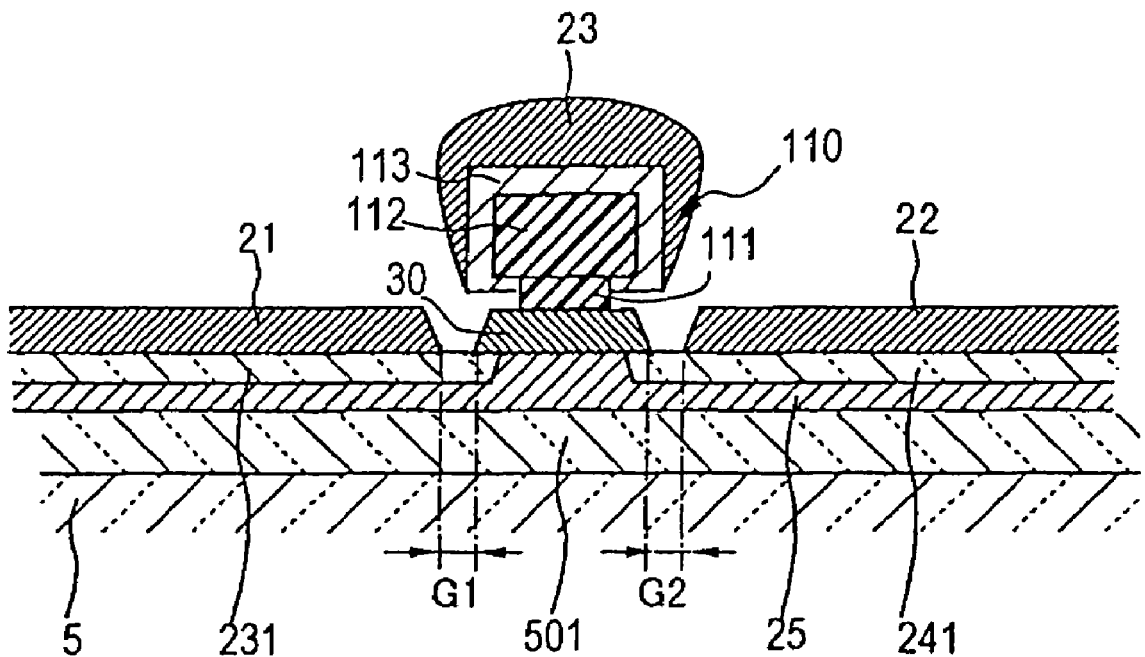
FIG. 35 is a cross sectional view showing a step after the step shown in FIG. 34.

First of all, as shown in FIG. 35, the magnetic domain controlling films 21 and 22 are formed by means of film forming technique such as sputtering or CVD via the laminated resist pattern 110 which is not removed from on the GMR film 30. In this case, some debris 23 is attached on the top resist pattern 112 of the laminated resist pattern 110.

In the fabrication of the magnetic domain controlling films 21 and 22, the laminated resist pattern 110 is not removed and remains on the first patterned thin film 30, and only the width (surface area) of the top resist pattern 112 is enlarged.

Therefore, since the magnetic domain controlling films 21 and 22 (second patterned thin films) are formed along the contour of the top resist pattern 112 by means of film forming technique such as sputtering, they are formed at both sides of the GMR film 30 (first patterned thin film) by the minute gaps of G1 and G2 due to the enlargement of the surface area of the top resist pattern 112. In this case, since the laminated resist pattern 110 is not removed and remains on the GMR film 30, it can be formed and positioned precisely for the GMR film 30.

Moreover, since it is only required to expand the top resist pattern 112 of the laminated resist pattern 110 without the formation of another mask, the magnetic domain controlling films 21 and 22 can be formed simply, in addition to the GMR film 30.

Figure 36:
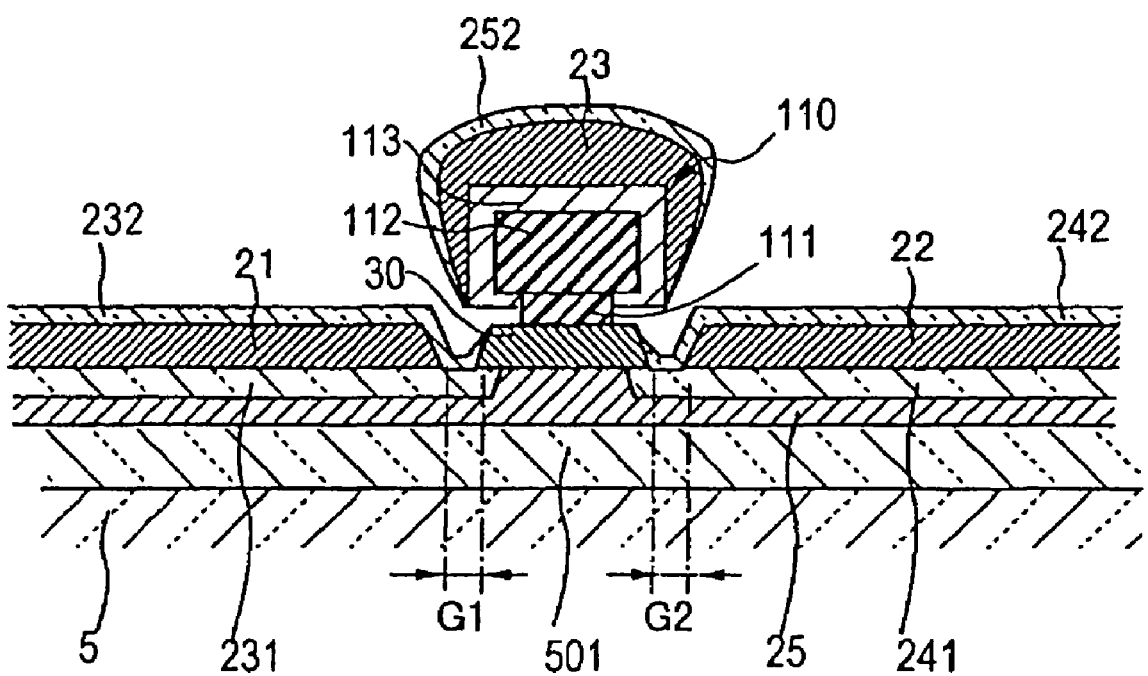
FIG. 36 is a cross sectional view showing a step after the step shown in FIG. 35.

Then, as shown in FIG. 36, the insulating films 232 and 242 are patterned by means of film forming technique such as sputtering or CVD so as to embed the gaps G1 and G2 between the GMR film 30 and the magnetic domain controlling films 21, 22. Due to the insulating films 232 and 242, the magnetic domain controlling films 21 and 22 are electrically insulated.

If the gaps G1 and G2 are set much smaller, the thicknesses of the insulating films 232 and 242 can be reduced sufficiently, so that the controllability of the magnetic domain controlling films 21 and 22 for the GMR film 30 can be enhanced.

Figure 37:
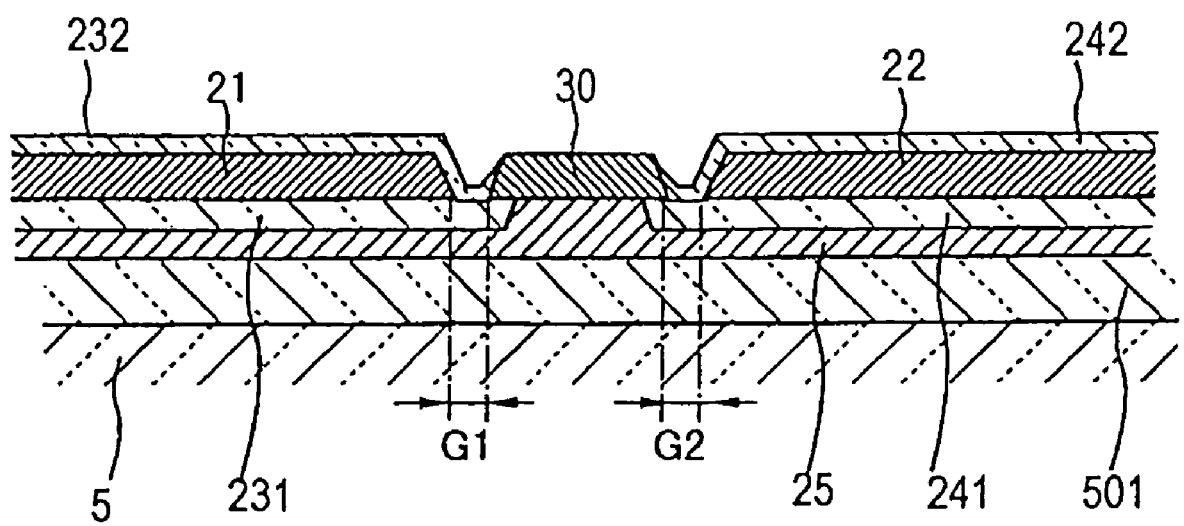
FIG. 37 is a cross sectional view showing a step after the step shown in FIG. 36.

Then, as shown in FIG. 37, the laminated resist pattern 110 is removed by means of lift off. Furthermore, the fabrication process of reading element and recording element will be carried out by means of a conventional technique.

Although the present invention was described in detail with reference to the above examples, this invention is not limited to the above disclosure and every kind of variation and modification may be made without departing from the scope of the present invention. For example, this invention can be applied to another micro device such as a semiconductor device, a sensor with a thin film, an actuator with a thin film and the like except the thin film magnetic head.

As mentioned above, according to the present invention can be provided the following effects:

(a) A new fabricating method of mask and patterned thin film can be provided, whereby another patterned thin film is positioned precisely for one patterned thin film. Moreover, a new micro device the patterned thin film can be provided.

(b) A new fabricating method of mask and patterned thin film can be provided, whereby a patterning process of thin film can be simplified. Moreover, and a new micro device with the patterned thin film can be provided.

What is claimed is:

1. A method for fabricating a mask, comprising:
    forming a film to be patterned;
    forming, on said film, a laminated resist pattern with a T-shaped cross section and composed of a bottom resist pattern and a top resist pattern, a surface area of said top resist pattern being larger than a surface area of said bottom resist pattern; and
    increasing a width of said top resist pattern after said film is patterned via said laminated resist pattern,
    wherein said surface area of said top resist pattern is increased by coating a water-soluble resin at least over said top resist pattern of said laminated resist pattern.

2. The fabricating method as defined in claim 1, wherein said water-soluble resin contain no crosslinking agent, and said surface area of said top resist pattern is increased due to the shrinkage of said water-soluble resin.

3. The fabricating method as defined in claim 1, wherein said water-soluble resin contain a crosslinking agent, and said surface area of said top resist pattern is increased by the formation of a membrane at least over said top resist pattern.

4. A method for fabricating a patterned thin film, comprising:
    forming a first thin film to be patterned;
    forming, on said first thin film, a laminated resist pattern with a T-shaped cross section and composed of a bottom resist pattern and a top resist pattern, a surface area of said top resist pattern being larger than a surface area of said bottom resist pattern;
    patterning said first thin film via said laminated resist pattern, to form a first patterned thin film;
    increasing a width of said top resist pattern; and
    forming a second patterned thin film along a contour of said top resist pattern of said laminated resist pattern,
    wherein said surface area of said top resist pattern is increased by coating a water-soluble resin at least over said top resist pattern of said laminated resist pattern.

5. The fabricating method as defined in claim 4, wherein said water-soluble resin contain no crosslinking agent, and said surface area of said top resist pattern is increased due to the shrinkage of said water-soluble resin.

6. The fabricating method as defined in claim 4, wherein said water-soluble resin contain a crosslinking agent, and said surface area of said top resist pattern is increased by the formation of a membrane at least over said top resist pattern.

7. A method for fabricating a patterned thin film, comprising:
    forming a first thin film to be patterned;
    forming, on said first thin film, a laminated resist pattern with a T-shaped cross section and composed of a bottom resist pattern and a top resist pattern, a surface area of said top resist pattern being larger than a surface area of said bottom resist pattern;
    patterning said first thin film via said laminated resist pattern, to form a first patterned thin film;
    increasing a width of said top resist pattern; and
    forming a second patterned thin film along a contour of said top resist pattern of said laminated resist pattern,
    wherein said second patterned thin film is located away from said first patterned thin film by a gap.

8. The fabricating method as defined in claim 7, wherein said second patterned thin film is composed of a pair of patterned thin films, which are located at both sides of said first patterned thin film by gaps.

9. A method for fabricating a mask, comprising:
    forming a film to be patterned;
    forming, on said film, a laminated resist pattern with a T-shaped cross section and composed of a bottom resist pattern and a top resist pattern, a surface area of said top resist pattern being larger than a surface area of said bottom resist pattern; and
    increasing a width of said top resist pattern after said film is patterned via said laminated resist pattern,
    wherein said bottom resist pattern is made of polymethylglutarimide (PMGI).

10. A method for fabricating a mask, comprising:
    forming a film to be patterned;
    forming, on said film, a laminated resist pattern with a T-shaped cross section and composed of a bottom resist pattern and a top resist pattern, a surface area of said top resist pattern being larger than a surface area of said bottom resist pattern; and
    increasing a width of said top resist pattern after said film is patterned via said laminated resist pattern,
    wherein said top resist pattern is made of a resist material with phenol-based hydroxide.

11. A method for fabricating a mask, comprising:
    forming a film to be patterned;
    forming, on said film, a laminated resist pattern with a T-shaped cross section and composed of a bottom resist pattern and a top resist pattern, a surface area of said top resist pattern being larger than a surface area of said bottom resist pattern; and
    increasing a width of said top resist pattern after said film is patterned via said laminated resist pattern,
    wherein said laminated resist pattern is not removed through the fabrication process of patterned thin film.

12. A method for fabricating a mask, comprising:
    forming a film to be patterned;
    forming, on said film, a laminated resist pattern with a T-shaped cross section and composed of a bottom resist pattern and a top resist pattern, a surface area of said top resist pattern being larger than a surface area of said bottom resist pattern; and
    increasing a width of said top resist pattern after said film is patterned via said laminated resist pattern,
    wherein said film is patterned via said laminated resist pattern by means of dry etching.

13. A method for fabricating a patterned thin film, comprising:
    forming a first thin film to be patterned;
    forming, on said first thin film, a laminated resist pattern with a T-shaped cross section and composed of a bottom resist pattern and a top resist pattern, a surface area of said top resist pattern being larger than a surface area of said bottom resist pattern;
    patterning said first thin film via said laminated resist pattern, to form a first patterned thin film;
    increasing a width of said top resist pattern; and forming a second patterned thin film along a contour of said top resist pattern of said laminated resist pattern, wherein said bottom resist pattern is made of polymethylglutarimide (PMGI).

14. A method for fabricating a patterned thin film, comprising:

forming a first thin film to be patterned;

forming, on said first thin film, a laminated resist pattern with a T-shaped cross section and composed of a bottom resist pattern and a top resist pattern, a surface area of said top resist pattern being larger than a surface area of said bottom resist pattern;

patterning said first thin film via said laminated resist pattern, to form a first patterned thin film;

increasing a width of said top resist pattern; and forming a second patterned thin film along a contour of said top resist pattern of said laminated resist pattern, wherein said top resist pattern is made of a resist material with phenol-based hydroxide.

15. A method for fabricating a patterned thin film, comprising:

forming a first thin film to be patterned;

forming, on said first thin film, a laminated resist pattern with a T-shaped cross section and composed of a bottom resist pattern and a top resist pattern, a surface area of said top resist pattern being larger than a surface area of said bottom resist pattern;

patterning said first thin film via said laminated resist pattern, to form a first patterned thin film;

increasing a width of said top resist pattern; and forming a second patterned thin film along a contour of said top resist pattern of said laminated resist pattern, wherein said laminated resist pattern is not removed through the fabrication process of said first patterned thin film and said second patterned thin film.

16. A method for fabricating a patterned thin film, comprising:

forming a first thin film to be patterned;

forming, on said first thin film, a laminated resist pattern with a T-shaped cross section and composed of a bottom resist pattern and a top resist pattern, a surface area of said top resist pattern being larger than a surface area of said bottom resist pattern;

patterning said first thin film via said laminated resist pattern, to form a first patterned thin film;

increasing a width of said top resist pattern; and forming a second patterned thin film along a contour of said top resist pattern of said laminated resist pattern, wherein said film is patterned via said laminated resist pattern by means of dry etching.

* * * * *